United States Patent
Schmaunz et al.

(10) Patent No.: US 11,158,485 B2
(45) Date of Patent: Oct. 26, 2021

(54) OPERATING A PARTICLE BEAM DEVICE

(71) Applicant: Carl Zeiss Microscopy GmbH, Jena (DE)

(72) Inventors: Andreas Schmaunz, Oberkochen (DE); Wolfgang Berger, Gerstetten (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/818,806

(22) Filed: Mar. 13, 2020

(65) Prior Publication Data
US 2020/0388463 A1    Dec. 10, 2020

(30) Foreign Application Priority Data
Mar. 15, 2019   (DE) .......................... 102019203579.5

(51) Int. Cl.
*H01J 37/26*   (2006.01)
*H01J 37/22*   (2006.01)
(Continued)

(52) U.S. Cl.
CPC ........ *H01J 37/265* (2013.01); *G01N 23/2251* (2013.01); *H01J 37/147* (2013.01);
(Continued)

(58) Field of Classification Search
CPC ........ H01J 37/265; H01J 37/147; H01J 37/20; H01J 37/244; H01J 37/28; G01N 23/2251;
(Continued)

(56) References Cited

U.S. PATENT DOCUMENTS 5,093,572 A    3/1992   Hosono
6,452,172 B1 *  9/2002   Oi .......................... H01J 37/28
                                                        250/310

(Continued)

FOREIGN PATENT DOCUMENTS

DE    11 2014 000 306 T5   9/2015
EP        3 467 866 A1      4/2019

OTHER PUBLICATIONS

Peter. Gnauck, et al., "New crossbeam inspection tool combining an ultrahigh-resolution field emission SEM and a high-resolution FIB," Metrology, Inspection, and Process Control for Microlithography XVI, International Society for Optics and Photonics, 2002, pp. 833-840.

*Primary Examiner* — Sean M Luck
(74) *Attorney, Agent, or Firm* — Muirhead and Saturnelli, LLC

(57) ABSTRACT

A particle beam device comprises a first particle beam column for providing a first particle beam and a second particle beam column for providing a second particle beam. Operating the particle beam device may include: supplying the second particle beam with second charged particles onto an object using the second particle beam column, loading a value of a control parameter into a control unit from a database or calculating the value of the control parameter in the control unit, setting an objective lens excitation of a first objective lens of the first particle beam column using the value of the control parameter, detecting second interaction particles using a particle detector. The second interaction particles may emerge from an interaction of the second particle beam with the object when the second particle beam is incident on the object.

16 Claims, 11 Drawing Sheets

(51) Int. Cl.
  *H01J 37/14* (2006.01)
  *G01N 23/2251* (2018.01)
  *H01J 37/147* (2006.01)
  *H01J 37/20* (2006.01)
  *H01J 37/244* (2006.01)
  *H01J 37/28* (2006.01)

(52) U.S. Cl.
  CPC ............ *H01J 37/20* (2013.01); *H01J 37/244* (2013.01); *H01J 37/28* (2013.01); *G01N 2223/07* (2013.01); *G01N 2223/408* (2013.01); *G01N 2223/507* (2013.01)

(58) Field of Classification Search
  CPC ......... G01N 2223/07; G01N 2223/408; G01N 2223/507
  See application file for complete search history.

(56) References Cited

U.S. PATENT DOCUMENTS

| | | | |
|---|---|---|---|
| 6,486,471 B1 * | 11/2002 | Oi | H01J 37/09 250/309 |
| 7,411,192 B2 * | 8/2008 | Takeuchi | H01J 37/09 250/306 |
| 8,399,864 B2 | 3/2013 | Hill et al. | |
| 10,103,002 B1 * | 10/2018 | Gamm | H01J 37/222 |
| 2010/0301211 A1 | 12/2010 | Miller | |
| 2015/0364296 A1 | 12/2015 | Nomaguchi et al. | |
| 2016/0203948 A1 * | 7/2016 | Huynh | H01J 37/244 250/307 |
| 2017/0336335 A1 | 11/2017 | Hendrich et al. | |
| 2018/0190469 A1 * | 7/2018 | Cheng | H01J 37/141 |

* cited by examiner

OPERATING A PARTICLE BEAM DEVICE

CROSS-REFERENCE TO RELATED APPLICATION

This application claims the priority of the German patent application No. 10 2019 203 579.5, filed on Mar. 15, 2019, which is incorporated herein by reference.

TECHNICAL FIELD

The system described herein relates to a method for operating a particle beam device and a particle beam device for carrying out the method. The particle beam device comprises an electron beam device, for example in the form of an electron beam column, and ion beam device, for example in the form of an ion beam column.

BACKGROUND OF THE INVENTION

Electron beam devices, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions. In an SEM, an electron beam (also referred to as primary electron beam below) is generated by means of a beam generator and focused onto an object to be examined by way of a beam-guiding system. An objective lens is used for focusing purposes. The primary electron beam is guided over a surface of the object to be examined by way of a deflection device. This is also referred to as scanning. The area scanned by the primary electron beam is also referred to as scanning region. Here, the electrons of the primary electron beam interact with the object to be examined. Interaction particles and/or interaction radiation result as a consequence of the interaction. By way of example, the interaction particles are electrons. In particular, electrons are emitted by the object—so-called secondary electrons—and electrons of the primary electron beam are scattered back—so-called backscattered electrons. The interaction particles form the so-called secondary particle beam and are detected by at least one particle detector. The particle detector generates detection signals which are used to generate an image of the object. An imaging of the object to be examined is thus obtained. By way of example, the interaction radiation is x-ray radiation or cathodoluminescence light. At least one radiation detector is used to detect the interaction radiation.

In the case of a TEM, a primary electron beam is likewise generated by means of a beam generator and directed onto an object to be examined by means of a beam-guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective lens. By way of example, the aforementioned system additionally also comprises a projection lens. Here, imaging may also take place in the scanning mode of a TEM. As a rule, such a TEM is referred to as STEM. Additionally, provision may be made for detecting electrons scattered back at the object to be examined and/or secondary electrons emitted by the object to be examined by means of at least one further detector in order to image the object to be examined. Interaction radiation can also be detected in a TEM. At least one radiation detector is used to this end. By way of example, the interaction radiation is x-ray radiation or cathodoluminescence light.

Combining the function of a STEM and an SEM in a single particle beam device is known. It is therefore possible to carry out examinations of objects with an SEM function and/or with a STEM function using this particle beam device.

Moreover, a particle beam device in the form of an ion beam column is known. Ions used for processing an object are generated by means of an ion beam generator disposed in the ion beam column. By way of example, material of the object is ablated or material is applied onto the object under the supply of gas during the processing. The ions are used, additionally or alternatively, for imaging.

Furthermore, the prior art has disclosed the practice of analyzing and/or processing an object in a particle beam device using, firstly, electrons and, secondly, ions. By way of example, an electron beam column having the function of an SEM is disposed on the particle beam device. Additionally, an ion beam column, which was already explained above, is disposed on the particle beam device. The electron beam column with the SEM function is used, in particular, for examining further the processed or unprocessed object, but also for processing the object.

An object may be imaged with a high spatial resolution using an electron beam device. In particular, this is achieved by a very small diameter of the primary electron beam in the plane of the object. Further, the spatial resolution may improve the higher the electrons of the primary electron beam are initially accelerated in the electron beam device and decelerated to a desired energy (referred to as landing energy) at the end of the objective lens or in the region of the objective lens and the object. By way of example, the electrons of the primary electron beam are accelerated using an acceleration voltage of 2 kV to 30 kV and guided through an electron beam column of the electron beam device. The electrons of the primary electron beam are only decelerated to the desired landing energy, with which they are incident on the object, in the region between the objective lens and the object. By way of example, the landing energy of the electrons in the primary electron beam lies in the range between 10 eV and 30 keV.

It is known to operate a particle beam device comprising both an electron beam column and an ion beam column in such a way that an electron beam of the electron beam column is initially guided away from the object and subsequently only ions of an ion beam of the ion beam column strike the object. When the ions are incident on the object, there is an interaction between the ions and the object, within the scope of which secondary particles arise, for example in the form of secondary electrons. The secondary electrons are detected by a particle detector, which is disposed in a sample chamber of the particle device or in the electron beam column. The electron beam column is operated during the detection of the aforementioned secondary electrons using values of control parameters for control units of the electron beam column that substantially correspond to the values of the control parameters before the electron beam was guided away from the object. Consequently, electric and/or magnetic fields are generated in the region of a first objective lens of the electron beam column, said fields being able to influence the trajectories of the secondary electrons, which arise through the interaction of the ion beam with the object, in such a way that these do not strike the particle detector. It may then be the case that a desired quality of the generated image is not obtained or the quality of the generated image is low.

A user of a particle beam device comprising an electron beam column and an ion beam column is concerned when creating an image of the object generated by the electron beam column or by the ion beam column about obtaining an optimal image quality of an image of the object, which is required for examining said object. Expressed differently, a user always wishes to create an image of the object with such a high image quality that they are able to analyze the object to be examined well on account of the image and the image information contained therein. Here, the image quality may be determined by means of, e.g., objective criteria. By way of example, the image quality of an image becomes better with increasing resolution in the image or with increasing contrast. Alternatively, the image quality may be determined on the basis of subjective criteria. Here, a user determines individually as to whether or not an obtained image quality is sufficient. However, what may by all means occur in this case is that the image quality deemed sufficient by a first user is not considered sufficient by a second user. By way of example, the image quality of an image of an object also may be determined on the basis of the signal-to-noise ratio of the detector signal. The image quality is not sufficiently good in the case of a signal-to-noise ratio in the range from 0 to 5. By way of example, if the signal-to-noise ratio lies in the range from 20 to 40, this is referred to as a good signal-to-noise ratio (and hence also a good and sufficient image quality). The direction of the secondary particle beam also may be a measure for the image quality. The secondary electrons may be emitted from the object at different solid angles. Further, the backscattered electrons may be backscattered into different solid angles at the object. The direction of the secondary particle beam (i.e., the solid angle through which the secondary particle beam extends) may be influenced by tilting the primary electron beam and/or the object in relation to the optical axis of the electron beam column or ion beam column. As a result of this, it is possible, firstly, to choose the direction of the secondary particle beam in such a way that the secondary particle beam is incident on a desired particle detector. Secondly, it is possible to influence both the number of the generated secondary electrons and the number of the back-scattered backscatter electrons by way of the aforementioned tilting. By way of example, if the primary electron beam is incident into an object parallel to a crystal lattice of the object, the number of secondary electrons and/or backscattered electrons reduces. The detection signals attenuate. This leads to reduction in the image quality. It is possible to increase the number of secondary electrons and number of backscattered electrons by setting the tilt of the primary electron beam. Using such a setting, it is possible to differentiate crystals with a first orientation from crystals with a second orientation on the basis of the strength of the detection signals.

In order to obtain a good image quality of an image generated using an electron beam column or ion beam column, a user of a particle beam device known from the prior art generally initially chooses a desired landing energy, with which the electrons or ions are incident on the object. Following this, the user chooses settings of further control parameters of at least one control unit. By way of example, the control parameters are physical variables, in particular a control current or a control voltage, but also, e.g., the ratio of physical variables, in particular an amplification of physical variables. The values of the physical variables are adjustable using the control units, and may be fed to units of the particle beam device in such a way that desired physical effects, for example the generation of specific magnetic fields and/or electrostatic fields, are brought about.

A first control parameter of a first control unit sets the contrast in the generated image. In principle, the contrast is the brightness difference (i.e. the intensity difference) between the brightest pixel with a maximum luminance $L_{max}$ and the darkest pixel with a minimum luminance $L_{min}$ in an image. A smaller brightness difference between the two pixels means a low contrast. A larger brightness difference between the two pixels means a high contrast. By way of example, the contrast may be specified as Weber contrast or as Michelson contrast. Here, the following applies for the Weber contrast:

$$K_w = \frac{L_{max}}{L_{min}} - 1 \text{ with } 0 \leq K_W \leq \infty \qquad [1]$$

The following applies for the Michelson contrast:

$$K_M = \frac{L_{max} - L_{min}}{L_{max} + L_{min}} \text{ with } 0 \leq K_M \leq 1 \qquad [2]$$

The contrast which is substantially generated by the secondary electrons is determined by the topography of the surface of the object. On the other hand, the contrast which is substantially generated by the backscattered electrons is substantially determined by the material of the imaged object region. It is also referred to as material contrast. The material contrast depends on the mean atomic number of the imaged region of the object. By way of example, the contrast increases when a higher gain factor is set at an amplifier of the particle detector, wherein the particle detector is used to detect the secondary electrons and/or backscattered electrons. The amplifier amplifies the detection signals generated by the particle detector. Analogously, the contrast, e.g., decreases when a smaller gain factor is set at the amplifier of the particle detector.

A second control parameter of a second control unit sets the brightness in the generated image. In principle, the brightness in an image is related to each pixel in the image. A first pixel with a higher brightness value than a second pixel appears brighter in the image than the second pixel. By way of example, the brightness is set by setting a gain factor of the detection signals of the particle detector. Here, the brightness of each pixel in the image is increased or lowered by an identical amount, for example also using a color table stored in a memory unit, with a specific brightness corresponding to a color included in the color table.

A third control parameter of a third control unit is used, for example, for driving the first objective lens of the electron beam column, which is used to set the focusing of the primary electron beam on the object, or for driving the second objective lens of the ion beam column, which is used to set the focusing of the ion beam on the object.

A fourth control parameter for driving a fourth control unit is used for centering the primary electron beam in the first objective lens of the electron beam column or for centering the ion beam in the second objective lens of the ion beam column. The fourth control unit is used for setting, e.g., electrostatic and/or magnetic units of the electron beam column and/or the ion beam column, which are used for setting the centration of the primary electron beam in the first objective lens of the electron beam column or the centration of the ion beam in the second objective lens of the ion beam column.

Moreover, the image quality of an image of the object is influenced by a fifth control parameter of a fifth control unit for controlling and setting electrostatic and/or magnetic deflection units which are used in the electron beam column or the ion beam column for a so-called "beam shift". As a result of this, it is possible to set the position of the scanning region and optionally displace the scanning region to a desired position. This may occur without the use of a sample stage (also referred to as object holder below) on which the object is disposed. By way of example, if the scanning region migrates out of the actual region of the object observed by means of the electron beam column or the ion beam column on account of a change in the settings on the electron beam column or the ion beam column, the primary electron beam or the ion beam is displaced in such a way as a result of translational movements in the case of a "beam shift" that the scanning region once again lies in the desired observed region.

A stigmator used in an electron beam column or ion beam column can influence the image quality of the image of the object. The stigmator—a magnetic and/or electrostatic multi-pole element—is used, in particular, for correcting an astigmatism. The stigmator may be set by a sixth control unit by means of a sixth control parameter.

However, the image quality of an image of the object can also be influenced by the position of a mechanically displaceable unit of the electron beam device or of the ion beam device. By way of example, the image quality is influenced by the position of an aperture unit which is disposed in the electron beam column and used to shape and delimit the primary electron beam in the electron beam column. Further, the image quality, for example, is influenced by the position of an aperture unit which is disposed in the ion beam column and used to shape and delimit the ion beam in the ion beam column.

Further, the image quality of an image of the object can be influenced by the so-called scan rotation. This is a rotation of the scanning region in the plane of the scanning region about a first optical axis of the electron beam column or about a second optical axis of the ion beam column.

Therefore, in order to obtain a desired image quality of an image of an object, the user should take into account as many of the aforementioned control parameters as possible and/or further control parameters not specified here, with the physical effects obtained by the individual control parameters influencing one another in turn. The following procedures for ascertaining suitable values of the control parameters, by means of which a desired image quality can be obtained, are known to the applicant: By way of example, mathematical models can be used to ascertain suitable values of the individual control parameters in order to obtain a desired image quality. However, these calculated and theoretical values of the control parameters are often unsuitable for obtaining a really good image quality. This may be due to the fact that, for example, not all control parameters are taken into account in the mathematical models and/or the mathematical models are based on simplified assumptions which are more complicated in reality. In a further known method, provision is made for ascertaining the values of the various control parameters by experiment, with, for example, a reference sample being used for ascertainment by experiment. The ascertained values of the control parameters are used to set the control units of the electron beam column or ion beam column. However, it is disadvantageous that an object to be examined and imaged does not always correspond to the reference sample, in particular in respect of the material composition and the topography. This may lead to optical aberrations and hence to a deterioration in the image quality which is actually obtained. A further known method is that of setting the image quality by manually searching the desired image quality for an object to be imaged. Here, the desired landing energy of the electrons or the ions, with which the electrons of the primary electron beam or the ions of the ion beam are incident on the object to be examined, is selected first. Subsequently, the brightness, the contrast, the focusing, the centration of the primary electron beam in the first objective lens of the electron beam column, the centration of the ion beam in the second objective lens of the ion beam column, the beam shift and/or the position of the adjustable unit are varied and matched to one another by trials in such a way until the desired image quality is obtained.

SUMMARY OF THE INVENTION

The system described herein may include a method and a particle beam device with two particle beam columns for carrying out the method, by means of which the quality of an image generated by detection of secondary electrons may be improved, wherein the secondary electrons are generated by an interaction of a second particle beam of a second particle beam column with an object. By way of example, the second particle beam is an ion beam.

An embodiment of the method according the system described herein is used to operate a particle beam device, which may be used to generate an image of an object. The particle beam device may comprise a first particle beam column for providing a first particle beam and a second particle beam column for providing a second particle beam. By way of example, the first particle beam column may be embodied as an electron beam column. Moreover, the second particle beam column may be embodied as an ion beam column, for example. In particular, provision may be made for the first particle beam column to have a first beam generator for generating the first particle beam with first charged particles, and at least one first objective lens for focusing the first particle beam onto the object. The first charged particles are electrons or ions, for example. Moreover, provision may be made, in particular, for the second particle beam column to have at least one second beam generator for generating the second particle beam comprising second charged particles. The second charged particles are ions, for example.

An embodiment of the method according the system described herein comprises supplying the second particle beam with the second charged particles onto the object using the second particle beam column. By way of example, the second particle beam may be focused onto the object using a second objective lens of the second particle beam column.

Further, a value of a control parameter may be loaded from a database in a control unit. In addition or as an alternative thereto, the value of the control parameter is calculated in the control unit. By way of example, the control parameter may be a physical variable, in particular a control current or a control voltage, but also, e.g., the ratio of physical variables, in particular an amplification of physical variables. The values of the physical variables may be adjustable at the control unit or using the control unit and these control and/or feed units of the particle beam device in such a way that desired physical effects, for example, the generation of specific magnetic fields and/or electrostatic fields, are brought about.

In an embodiment of the method according the system described herein, an objective lens excitation of the first objective lens of the first particle beam column is set using the value of the control parameter that was loaded from the database or calculated using the control unit. By way of example, exciting the objective lens comprises setting a current, i.e., an objective lens current, and/or a voltage, i.e., an objective lens voltage. Further, second interaction particles may be detected using a particle detector. The particle detector may be disposed in or on the first particle beam column. In particular, the particle detector may be disposed in a region between the first objective lens and the first beam generator of the first particle beam column and/or the particle detector may be disposed at an end of the first objective lens. By way of example, the end of the first objective lens may be disposed on the object side. The second interaction particles emerge from an interaction of the second particle beam with the object when the second particle beam is incident on the object.

By way of example, an embodiment of the method according the system described herein also comprises a removal of the first particle beam with the first of charged particles, which may be guided to the object by the first particle beam column, from the object. In particular, provision may be made for the removal of the first particle beam from the object to be implemented temporally before and/or during the supply of the second particle beam. This will be discussed again below.

In the case of a particle beam device with the first particle beam column and the second particle beam column, an embodiment of the system described herein allows images with a good and/or desired quality to be generated by the particle detector by way of the detection of second interaction particles, which arise on account of the interaction of the second particle beam with the object. The value of the control parameter may be loaded from the database or calculated in the control unit and used to drive the objective lens excitation of the first objective lens of the first particle beam column in such a way that sufficiently many of the second interaction particles and/or the second interaction particles from a desired angular range are guided from the object to the particle detector. Consequently, the value of the control parameter for driving the first objective lens of the first particle beam column does not remain at a value used for the supply of the first particle beam of the first particle beam column onto the object; instead, the objective lens excitation of the first objective lens of the first particle beam column may be driven in such a way that sufficiently many of the second interaction particles and/or the second interaction particles from a desired angular range reach the particle detector. By way of example, they reach the particle detector through the first objective lens, said particle detector being disposed between the first objective lens and the first particle beam generator in the first particle beam column. In addition or as an alternative thereto, they reach the particle beam detector disposed on or in the first particle beam column.

As already explained above, provision may be additionally or alternatively made in one embodiment of the method according to the system described herein for the first particle beam with the first charged particles, guided to the object using the first particle beam column, to be removed from the object. In addition or as an alternative thereto, provision is made for a current of the first particle beam having first charged particles, which particle beam may be provided by the first particle beam column and guided to the object, to be reduced. The reduction may be implemented in such a way that a ratio of second detection signals, which may be generated by the particle detector on account of the detected second interaction particles, to first detection signals, which may be generated by the particle detector on account of detected first interaction particles, may be greater than 2. The first interaction particles may emerge from the interaction of the first particle beam with the object when the first particle beam is incident on the object.

By way of example, the removal of the first particle beam from the object or the reduction of the current of the first particle beam is implemented temporally before and/or during the supply of the second particle beam onto the object. In particular, in one embodiment of the method according to the system described herein, provision is additionally or alternatively made for the removal of the first particle beam or the reduction of the current of the first particle beam to comprise at least one of the following steps: (i) guiding the first particle beam away from the object using a guiding unit, for example of an electrostatic and/or magnetic guiding unit, (ii) masking the first particle beam by moving an aperture unit, (iii) deactivating a high-voltage supply unit of the first beam generator of the first particle beam column in such a way that the first particle beam is not generated or operating the high-voltage supply unit of the first beam generator of the first particle beam column in such a way that the first particle beam is not sufficiently generated so that the first interaction particles are not detected by the particle detector, (iv) guiding the first particle beam away from the object using a scanning apparatus and (v) changing an excitation of at least one condenser lens.

In a further embodiment of the method according to the system described herein, provision is additionally or alternatively made for the value of the control parameter to be ascertained as follows prior to the readout of the database. Initially, at least one of the following properties of the particle beam device may be chosen, set and/or determined:

a rotation of an object holder on which the object is disposed. By way of example, the object holder is embodied to be movable in three directions which are disposed perpendicular to one another. Further, the object holder may, e.g., be rotated about a first axis of rotation and/or about a second axis of rotation. By way of example, the first axis of rotation and the second axis of rotation are disposed perpendicular to one another. The rotational position of the object holder may be determined in the embodiment. In addition or as an alternative thereto, the rotation, and hence the rotational position, of the object holder is chosen, set and/or determined;

a distance between the object and the first objective lens. Said distance is also referred to as working distance. By way of example, the distance lies in the range from 0.3 mm to 20 mm or in the range from 0.5 mm to 12 mm. The range limits may be included in the predeterminable ranges. Reference is explicitly made to the fact that the aforementioned distance values should only be understood to be illustrative and not restrictive. Instead, other values for the distance also may be chosen;

a material of the object. Accordingly, the material which the object consists of and/or from which it is composed may be determined or chosen;

a surface roughness of the object;

a landing energy of the second charged particles of the second particle beam on the object. The landing energy of the second charged particles is the energy with which the object is examined and/or imaged. The landing energy of the second charged particles may differ from the energy with which the second charged particles are guided through the second particle beam column. By way of example, provision is made for initially accelerating the second charged particles very strongly and only decelerating the latter to the landing energy just before incidence on the object. By way of example, the landing energy of the second charged particles lies in the range between 1 eV and 30 keV;

an orientation of a surface of the object;

an acceleration voltage, with which the first particle beam may be guided within the first particle beam column.

Further, the value of the control parameter may be altered and set until an image of the object with a desired image quality is generated on the basis of the second detection signals of the particle detector. The second detection signals may be generated by the particle detector when detecting the second interaction particles using the particle detector. Thus, the value of the control parameter may be altered for the purposes of driving and/or setting the objective lens excitation of the first objective lens of the first particle beam column. By way of example, the image quality may be determined by means of objective criteria. By way of example, the image quality of an image becomes better with increasing resolution in the image or with increasing contrast. Alternatively, the image quality may be determined on the basis of subjective criteria. Here, a user may determine individually as to whether or not an obtained image quality is sufficient. However, what may by all means occur in this case is that the image quality deemed sufficient by a first user is not considered sufficient by a second user. By way of example, the image quality of an image of an object also may be determined on the basis of the signal-to-noise ratio of the detector signal. The image quality may not be sufficiently good in the case of a signal-to-noise ratio in the range from 0 to 5. By way of example, if the signal-to-noise ratio lies in the range from 20 to 40, this may be referred to as a good signal-to-noise ratio (and hence also a good and sufficient image quality). The direction of the beam of the second interaction particles also may be a measure for the image quality. The second interaction particles may be emitted from the object at different solid angles. The direction of the beam of second interaction particles (i.e., the solid angle through which the beam of second interaction particles extends) may additionally be influenced by tilting the second particle beam and/or the object in relation to the optical axis of the second particle beam column. As a result of this, it is possible, firstly, to choose the direction of the beam of the second interaction particles in such a way that the second interaction particles are incident on the particle detector. Secondly, the number of second interaction particles generated may be influenced by the aforementioned tilt. By way of example, if the second particle beam is incident into an object parallel to a crystal lattice of the object, the number of second interaction particles reduces. The second detection signals attenuate. This leads to reduction in the image quality. It is possible to increase the number of second interaction particles by setting the tilt of the second particle beam. Using such a setting, it is possible to differentiate crystals with a first orientation from crystals with a second orientation on the basis of the strength of the second detection signals.

Further, the value of the control parameter in which the image generated by the detection of the second interaction particles generated upon incidence of the second particle beam on the object has the desired image quality may be stored in the database as a function of the chosen, set and/or determined aforementioned at least one property, i.e., the rotation of an object holder on which the object is disposed, the distance between the object and the first objective lens, the material of the object, the surface roughness of the object, the landing energy of the second charged particles of the second particle beam on the object, the orientation of the surface of the object and the acceleration voltage, with which the first particle beam may be guided within the first particle beam column.

It is explicitly noted that the system described herein is not limited to aforementioned properties. Rather, any property of the particle beam device that is suitable for carrying out an embodiment of the method according the system described herein may be used for the system described herein. The aforementioned embodiments of the method according to the system described herein may be used multiple times in succession for determining numerous values of the control parameter, each value of the control parameter being ascertained in the case of different properties of the particle beam device. In this way, the value of the control parameter with which the objective lens excitation of the first objective lens of the first particle beam column may be driven and set to obtain the desired or sufficient image quality may be obtained for each property of the particle beam device.

In a yet further embodiment of the method according to the system described herein, provision is additionally or alternatively made for a functional relationship to be determined, which may be used to calculate the value of the control parameter in the control unit. Initially, at least one of the following properties of the particle beam device also may be chosen, set and/or determined in this further embodiment:

the rotation of the object holder on which the object is disposed. What was stated above in respect of the object holder also applies in this case;

the distance between the object and the first objective lens. What was stated above in respect of the distance also applies in this case;

the material of the object. What was stated above in respect of the material also applies in this case;

the surface roughness of the object;

the landing energy of the second charged particles of the second particle beam on the object. What was stated above in respect of the landing energy also applies in this case;

the orientation of the surface of the object;

the acceleration voltage, with which the first particle beam is guided within the first particle beam column.

Further, the value of the control parameter may be set and/or altered to a first value at which a first image of the object is obtained with a desired image quality on account of the second detection signals when the second particle beam is used. The second detection signals may be generated by the particle detector when detecting the second interaction particles using the particle detector. Thus, the value of the control parameter may be set and/or altered for the purposes of driving and/or setting the objective lens excitation of the first objective lens of the first particle beam column. What was stated above in respect of the image quality also applies in this case.

Moreover, in the yet further embodiment of the method according to the system described herein, the previously chosen at least one property of the particle beam device is chosen, set and/or determined again:
- the rotation of the object holder on which the object is disposed. What was stated above in respect of the object holder also applies in this case;
- the distance between the object and the first objective lens. What was stated above in respect of the distance also applies in this case;
- the material of the object. What was stated above in respect of the material also applies in this case;
- the surface roughness of the object;
- the landing energy of the second charged particles of the second particle beam on the object. What was stated above in respect of the landing energy also applies in this case;
- the orientation of the surface of the object;
- the acceleration voltage, with which the first particle beam is guided within the first particle beam column.

Further, the value of the control parameter may be set and/or altered to a second value at which a second image of the object is obtained with a desired image quality on account of the second detection signals of the particle detector when the second particle beam is used. The second detection signals may be generated by the particle detector when detecting the second interaction particles using the particle detector. Thus, the value of the control parameter may be altered for the purposes of driving and/or setting the objective lens excitation of the first objective lens of the first particle beam column. What was stated above in respect of the image quality also applies in this case. Moreover, a functional relationship may be determined between the first value of the control parameter and the second value of the control parameter as a function of the at least one property chosen. Here, the functional relationship may be determined by different methods, which are explained in more detail below. The functional relationship may be a linear relationship or a nonlinear relationship. A step function may by all means also be comprised by the functional relationship or form the functional relationship. Accordingly, according to an embodiment of the system described herein, a functional relationship is now ascertained between the first value of the control parameter and the second value of the control parameter as a function of the at least one property chosen.

Once the aforementioned functional relationship has been determined, it may be possible in one embodiment of the method according to the system described herein to calculate the value of the control parameter in the control unit as a function of at least one of the aforementioned properties and use this value to drive and set the objective lens excitation of the first objective lens of the first particle beam column.

In a further embodiment of the method according to the system described herein, provision is additionally or alternatively made for the control parameter to be a first control parameter, for the functional relationship to be a first functional relationship and for an embodiment of the method according the system described herein to further comprise the following steps: loading at least one value of a second control parameter into the control unit from the database and/or calculating the value of the second control parameter in the control unit, and driving at least one electrostatic and/or magnetic deflection unit for deflecting the second interaction particles in the first particle beam column using the value of the second control parameter. By way of example, the second control parameter is a physical variable, in particular a control current or a control voltage, but also, e.g., the ratio of physical variables, in particular an amplification of physical variables. The values of the physical variables may be adjustable at the control unit or using the control unit and these control and/or feed units of the particle beam device in such a way that desired physical effects, for example the generation of specific magnetic fields and/or electrostatic fields, are brought about. The aforementioned embodiment facilitates a further option for further improving the quality of an image of the object that may be generated by the second interaction particles generated upon incidence of the second particle beam on the object. The value of the second control parameter may be loaded from the database or calculated in the control unit and used to drive the electrostatic and/or magnetic deflection unit, disposed in the first particle beam column, for deflecting the second interaction particles in the first particle beam column in such a way that sufficiently many of the second interaction particles and/or the second interaction particles from a desired angular range are guided from the object to the particle detector.

In one embodiment of the method according to the system described herein, provision is additionally or alternatively made for the value of the second control parameter to be ascertained as follows prior to the readout of the database. Initially, at least one of the following properties of the particle beam device may be chosen, set and/or determined:
- the rotation of the object holder on which the object is disposed. What was stated above in respect of the object holder also applies in this case;
- the distance between the object and the first objective lens. What was stated above in respect of the distance also applies in this case;
- the material of the object. What was stated above in respect of the material also applies in this case;
- the surface roughness of the object;
- the landing energy of the second charged particles of the second particle beam on the object. What was stated above in respect of the landing energy also applies in this case;
- the orientation of the surface of the object;
- the acceleration voltage, with which the first particle beam is guided within the first particle beam column.

Further, the value of the second control parameter may be altered and/or set until an image of the object with a desired image quality is obtained on the basis of second detection signals of the particle detector. The second detection signals may be generated by the particle detector when detecting the second interaction particles using the particle detector. Thus, the value of the second control parameter may be ascertained for the purposes of driving and/or setting the electrostatic and/or magnetic deflection unit. By way of example, the image quality may be ascertained as already explained above. What was stated further above in respect of the image quality also applies in this case.

Further, the value of the second control parameter in which the image has the desired image quality may be stored in the database as a function of the chosen, set and/or determined aforementioned at least one property, i.e., the rotation of the object holder on which the object is disposed, the distance between the object and the first objective lens, the material of the object, the surface roughness of the object, the landing energy of the second charged particles of the second particle beam on the object, the orientation of the surface of the object and the acceleration voltage, with which the first particle beam is guided within the first particle beam column.

It is explicitly noted that the system described herein is not limited to the aforementioned properties. Rather, any property of the particle beam device that is suitable for carrying out an embodiment of the method according the system described herein may be used for the system described herein. The aforementioned embodiments of the method according to the system described herein may be used multiple times in succession for determining numerous values of the second control parameter, each value of the second control parameter being ascertained in the case of different properties of the particle beam device. In this way, the value of the second control parameter with which the electrostatic and/or magnetic deflection unit should be operated to obtain the desired or sufficient image quality may be obtained for each property of the particle beam device.

In a further embodiment of the method according to the system described herein, provision is additionally or alternatively made for a second functional relationship to be determined, which may be used to calculate the value of the second control parameter in the control unit. Initially, at least one of the following properties of the particle beam device may be also chosen, set and/or determined in this further embodiment:

the rotation of the object holder on which the object is disposed. What was stated above in respect of the object holder also applies in this case;

the distance between the object and the first objective lens. What was stated above in respect of the distance also applies in this case;

the material of the object. What was stated above in respect of the material also applies in this case;

the surface roughness of the object;

the landing energy of the second charged particles of the second particle beam on the object. What was stated above in respect of the landing energy also applies in this case;

the orientation of the surface of the object;

the acceleration voltage, with which the first particle beam is guided within the first particle beam column.

Further, the value of the second control parameter may be set and/or altered to a first value at which a third image of the object is obtained with the desired image quality on account of the second detection signals when the second particle beam is used. The second detection signals may be generated by the particle detector when detecting the second interaction particles using the particle detector. Thus, the value of the second control parameter may be altered for the purposes of driving and/or setting the electrostatic and/or magnetic deflection unit. What was stated above in respect of the image quality also applies in this case.

Moreover, in the yet further embodiment of the method according to the system described herein, the previously chosen, set and/or determined at least one property of the particle beam device may be yet again chosen, set and/or determined:

the rotation of the object holder on which the object is disposed. What was stated above in respect of the object holder also applies in this case;

the distance between the object and the first objective lens. What was stated above in respect of the distance also applies in this case;

the material of the object. What was stated above in respect of the material also applies in this case;

the surface roughness of the object;

the landing energy of the second charged particles of the second particle beam on the object. What was stated above in respect of the landing energy also applies in this case;

the orientation of the surface of the object;

the acceleration voltage, with which the first particle beam is guided within the first particle beam column.

Further, the value of the second control parameter may be set and/or altered to a second value at which a fourth image of the object is obtained with a desired image quality using the second particle beam and on account of the second detection signals of the particle detector. The second detection signals may be generated by the particle detector when detecting the second interaction particles using the particle detector. Thus, the value of the second control parameter may be altered for the purposes of driving and/or setting the electrostatic and/or magnetic deflection unit. What was stated above in respect of the image quality also applies in this case. Moreover, a second functional relationship may be determined between the first value of the second control parameter and the second value of the second control parameter as a function of the at least one property chosen, set and/or determined. Here, the second functional relationship may be determined by different methods, which are explained in more detail below. The second functional relationship may be a linear relationship or a nonlinear relationship. A step function may by all means also be comprised by the second functional relationship or form the second functional relationship. Accordingly, according to the system described herein, a second functional relationship may be now ascertained between the first value of the second control parameter and the second value of the second control parameter as a function of the at least one property chosen, set and/or determined.

Once the aforementioned second functional relationship has been determined, it is possible in one embodiment of the method according to the system described herein to calculate the value of the second control parameter in the control unit as a function of at least one of the aforementioned and specified properties and use this value to drive and/or set the electrostatic and/or magnetic deflection unit.

In one embodiment of the method according to the system described herein, provision is additionally or alternatively made for an additional coil, disposed on the first objective lens of the first particle beam column, to be driven for generating a magnetic field, wherein an effect of a first magnetic field, generated by the first objective lens, on the second interaction particles may be at least partly compensated. In addition or as an alternative thereto, provision is made for the second interaction particles to be guided by the magnetic field of the additional coil. In addition or as an alternative thereto, provision is made in an embodiment of the method according the system described herein for an additional electrode, disposed on the first objective lens, to be driven for guiding the second interaction particles into the first objective lens.

In a yet further embodiment of the method according to the system described herein, provision is additionally or alternatively made for at least one of the aforementioned functional relationships to be determined as follows: By way of example, the determination may be implemented by an interpolation. Any suitable interpolation method, for example a linear interpolation, a nonlinear interpolation, a trigonometric interpolation, a logarithmic interpolation and/ or a spline interpolation, may be used in the interpolation. In addition and/or as an alternative thereto, provision is made for the functional relationship to be determined by an extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the first value and the second value.

In one embodiment of the method according to the system described herein, provision is additionally or alternatively made for at least one of the aforementioned functional relationships to be a linear functional relationship or a nonlinear functional relationship.

An embodiment of the system described herein also relates to a computer program product comprising program code, which is loadable or loaded into a processor of a particle beam device, wherein the program code, when executed on the processor, controls the particle beam device in such a way that a method having at least one of the aforementioned or following features or having a combination of at least two of the aforementioned or following features is carried out.

An embodiment of the system described herein further relates to a particle beam device for generating an image of an object, wherein the particle beam device was already explained above and will be specified in more detail below. This will be briefly summarized below. The particle beam device according to the system described herein may comprise at least one first particle beam column, which in turn may have a first beam generator for generating a particle beam with first charged particles and at least one first objective lens for focusing the first particle beam onto the object. The first charged particles are electrons or ions, for example. Moreover, the particle beam device according to the system described herein may comprise at least one second particle beam column, which may have a second beam generator for generating a second particle beam with second charged particles. The second charged particles are ions, for example. In particular, provision may be made for the second particle beam column to have a second objective lens for focusing the second particle beam onto the object. Moreover, the particle beam device according to the system described herein is provided with at least one movably embodied object holder for holding, positioning and/or orienting the object. Moreover, the particle beam device according to the system described herein may comprise at least one particle detector for detecting second interaction particles which emerge from an interaction of the second particle beam with the object when the second particle beam is incident on the object, wherein the particle detector may be disposed in the region between the first objective lens and the first beam generator in the first particle beam column and/or wherein the particle detector may be disposed in the and/or at one end of the objective lens. Further, the particle beam device according to the system described herein may comprise at least one electrostatic and/or magnetic deflection unit for deflecting the second interaction particles onto the particle detector. Moreover, the particle beam device according to the system described herein may comprise at least one display unit for displaying an image of the object, wherein the image may be generated on the basis of the second detection signals, which may be generated by the detection of the second interaction particles using the particle detector. Moreover, the particle beam device according to the system described herein may comprise at least one processor, onto which a computer program product with the features already mentioned above or the features yet to be specified below is loaded.

In one embodiment of the particle beam device according to the system described herein, provision is additionally or alternatively made for the first particle beam column to be an electron beam column and/or for the second particle beam column to be an ion beam column. A primary electron beam may be generated by means of the electron beam column. An ion beam may be generated by means of the ion beam column.

BRIEF DESCRIPTION OF THE DRAWINGS

Further practical embodiments and advantages of the system described herein are described below in association with the drawings. In detail.

DESCRIPTION OF VARIOUS EMBODIMENTS

Embodiments of the system described herein are now explained in more detail by means of a particle beam device in the form of a combination device, which may have a first particle beam column and a second particle beam column. The first particle beam column may be an electron beam column and the second particle beam column may be an ion beam column. Express reference is made to the fact that the first particle beam column also may be embodied as an ion beam column.

Figure 1:
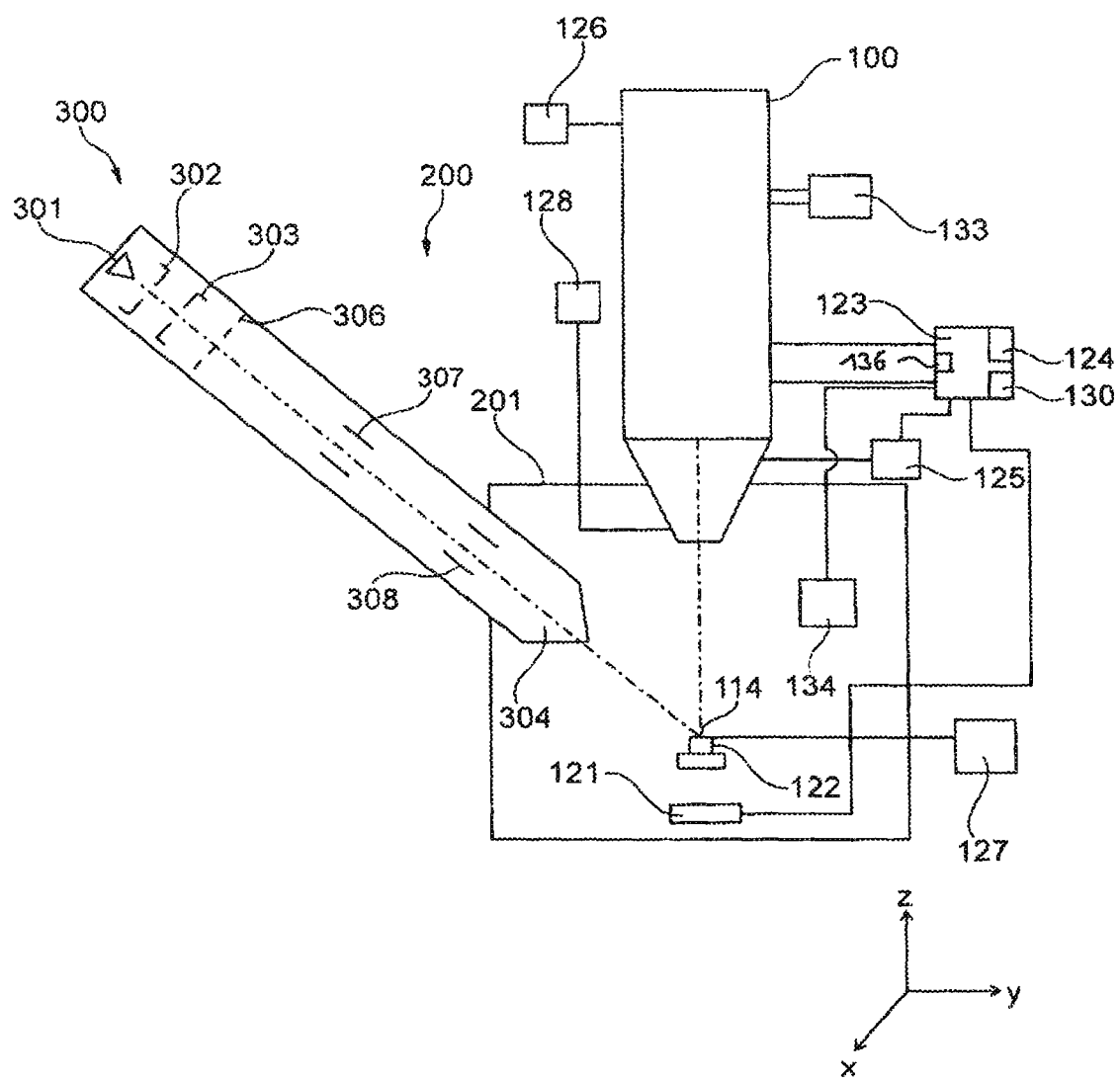
FIG. 1 shows a schematic illustration of an embodiment of a particle beam device according to the system described herein.

FIG. 1 shows a particle beam device 200 in the form of a combination device. The particle beam device 200 may have two particle beam columns. Firstly, the particle beam device 200 may have the first particle beam column in the form of an electron beam column 100. By way of example, the electron beam column 100 is an SEM. In addition to the electron beam column 100, the particle beam device 200 may comprise a second particle beam column in the form of an ion beam column 300. The electron beam column 100 and the ion beam column 300 may be disposed at a sample chamber 201. The sample chamber 201 may be under vacuum. For the purposes of generating the vacuum, a pump (not illustrated) may be disposed at the sample chamber 201. In the embodiment illustrated in FIG. 1, the sample chamber 201 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 201 may be vacuum-sealed.

The electron beam column 100 may be used to generate a first particle beam, namely a primary electron beam. The electron beam column 100 is explained in more detail below with reference to FIG. 2.

Figure 2:
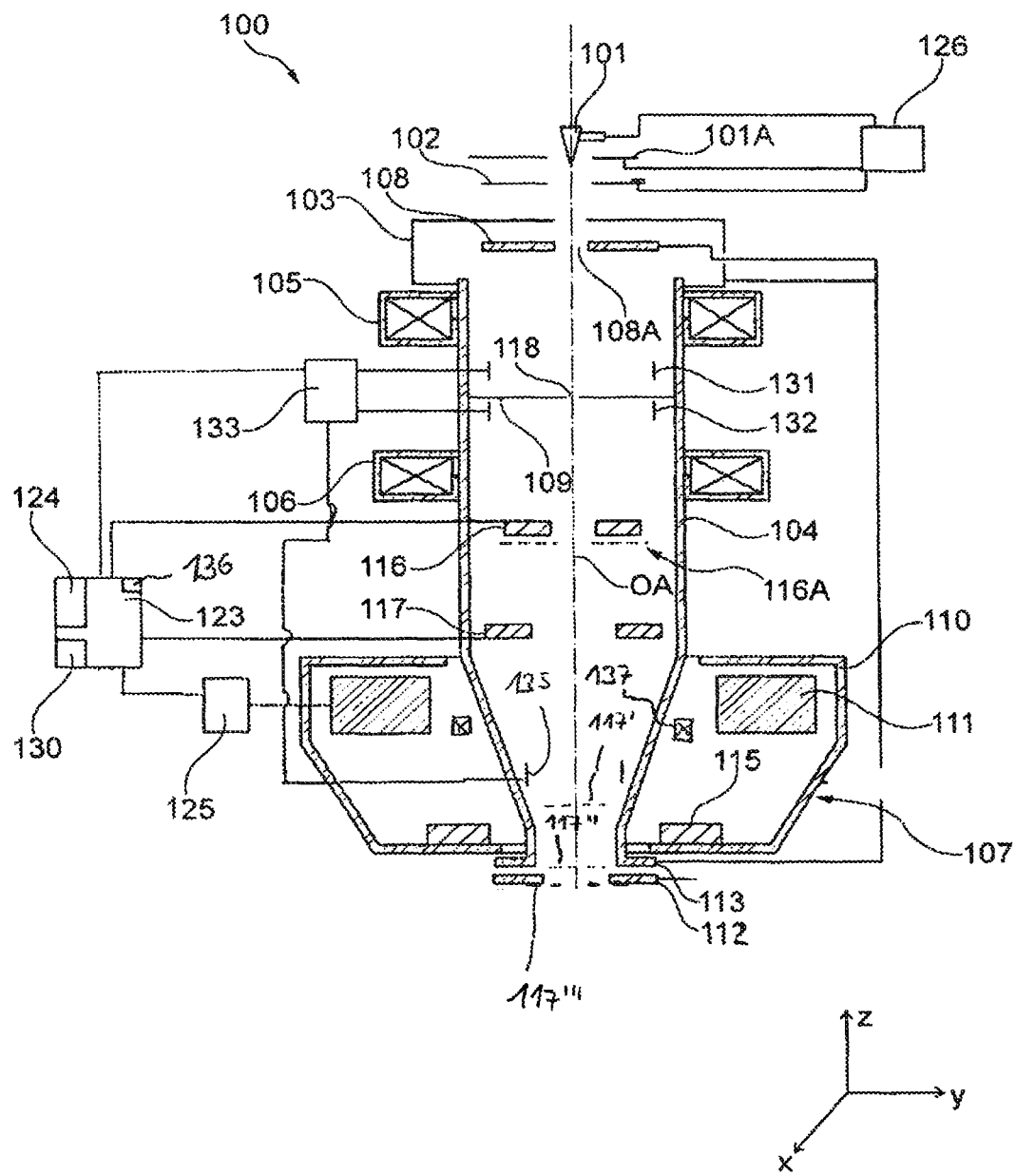
FIG. 2 shows a schematic illustration of an embodiment of a first particle beam column of the particle beam device according to FIG. 1.

FIG. 2 shows a schematic illustration of the electron beam column 100. The electron beam column 100 may comprise a first beam generator with an electron source 101, which may be embodied as a cathode. Moreover, the first beam generator may comprise a suppressor electrode 101A and an extraction electrode 102. Further, the electron beam column 100 may be provided with an anode 103, which may be placed onto one end of a beam-guiding tube 104 of the electron beam column 100. By way of example, the electron source 101 is embodied as a thermal field emitter. However, the system described herein is not restricted to such an electron source 101. Rather, any electron source is utilizable.

Electrons emerging from the electron source 101 form the primary electron beam. On account of a potential difference between the electron source 101 and the anode 103, the electrons are accelerated to a predeterminable kinetic energy in relation to a predeterminable potential. In the embodiment illustrated here, the potential may be 1 kV to 20 kV, e.g., 5 kV to 15 kV, in particular 8 kV, relative to a ground potential of a housing of the sample chamber 201. However, alternatively it could also be at ground potential.

Two condenser lenses, namely a first condenser lens 105 and a second condenser lens 106, may be disposed on the beam-guiding tube 104. Here, proceeding from the electron source 101 as viewed in the direction of a first objective lens 107, the first condenser lens 105 is disposed first, followed by the second condenser lens 106. Reference is explicitly made to the fact that further embodiments of the electron beam column 100 may have only a single condenser lens. A first aperture unit 108 may be disposed between the anode 103 and the first condenser lens 105. Together with the anode 103 and the beam-guiding tube 104, the first aperture unit 108 may be at a high voltage potential, namely the potential of the anode 103, or connected to ground. The first aperture unit 108 may have numerous first apertures 108A, of which one is illustrated in FIG. 2. By way of example, two first apertures 108A are present. Each one of the numerous first apertures 108A may have a different aperture diameter. By means of an adjustment mechanism (not illustrated), it is possible to set a desired first aperture 108A onto an optical axis OA of the SEM 100. Reference is explicitly made to the fact that, in further embodiments, the first aperture unit 108 may be provided with only a single aperture 108A. In this embodiment, an adjustment mechanism may be absent. The first aperture unit 108 then may be designed to be stationary.

A second aperture unit 109 may be disposed between the first condenser lens 105 and the second condenser lens 106. A first deflection unit 131 may be disposed on a first side of the second aperture unit 109 facing the electron source 101. Further, a second deflection unit 132 may be disposed on a second side of the second aperture unit 109 facing the second condenser lens 106. By way of example, both the first deflection unit 131 and the second deflection unit 132 have electrostatic and/or magnetic units, which may be adjustable by way of a drive variable. If the second aperture unit 109 is a displaceable single or multi-aperture unit, use may be made, for example, of at least one of the two deflection units 131 and 132. If the second aperture unit 109 is a stationary single aperture unit, then use may be made of at least two deflection units, for example the first deflection unit 131 and the second deflection unit 132. If the second aperture unit 109 is a stationary multi-aperture unit, use may be made of three deflection units (not illustrated), for example.

If the second aperture unit 109 has a displaceable embodiment, the latter forms the primary particle beam by way of the geometric form of an aperture of the second aperture unit 109. The second aperture unit 109 selects a partial beam of the primary particle beam and aligns the primary particle beam therewith. As a result, the second aperture unit 109 may be able to tilt the primary particle beam, but only about a virtual position of the electron source 101. Accordingly, the function of the displaceable second aperture unit 109 can be described as forming and aligning the primary electron beam. In a combination of a stationary second aperture unit 109 and a deflection unit, the function can be described analogously as forming and deflecting the primary electron beam.

The first objective lens 107 may have pole pieces 110, in which a bore may be formed. The beam-guiding tube 104 may be guided through this bore. Furthermore, a coil 111 may be disposed in the pole pieces 110.

An electrostatic retardation device may be disposed in a lower region of the beam-guiding tube 104. It may have an individual electrode 112 in the form of a termination electrode and a tube electrode 113. The individual electrode 112 may be disposed opposite to an object 114 (see FIG. 1). The tube electrode 113 may be disposed at one end of the beam-guiding tube 104, which faces the object 114. Together with the beam-guiding tube 104, the tube electrode 113 may be at the potential of the anode 103, while the individual electrode 112 and the object 114 may be at a lower potential in relation to the potential of the anode 103. In the present case, this may be the ground potential of the housing of the sample chamber 201. In this manner, the electrons of the primary electron beam may be decelerated to a desired energy which may be required for examining the object 114.

The electron beam column further may comprise a scanning device 115, by means of which the primary electron beam may be deflected and scanned over the object 114. Here, the electrons of the primary electron beam interact with the object 114. As a result of the interaction, first interaction particles, which are detected, arise. In particular, electrons are emitted from the surface of the object 114—so-called secondary electrons—or electrons of the primary electron beam are backscattered—so-called backscattered electrons—as first interaction particles.

The object 114 and the individual electrode 112 also may be at different potentials that deviate from ground, as already mentioned above. It is thereby possible to set the location of the retardation of the primary electron beam in relation to the object 114. By way of example, if the retardation is carried out very near to the object 114, imaging aberrations become smaller.

A detector arrangement comprising a first particle detector 116 and a second particle detector 117 may be disposed in the beam-guiding tube 104 for the purposes of detecting the secondary electrons and/or the backscattered electrons. Here, the first particle detector 116 may be disposed on the source side along the optical axis OA, while the second particle detector 117 may be disposed on the object side along the optical axis OA in the beam-guiding tube 104. The first particle detector 116 and the second particle detector 117 may be disposed offset from one another in the direction of the optical axis OA of the electron beam column 100. The first particle detector 116 and the second particle detector 117 each may have a passage opening, through which the primary electron beam may pass. The first particle detector 116 and the second particle detector 117 may be approximately at the potential of the anode 103 and of the beam-guiding tube 104. The optical axis OA of the electron beam column 100 extends through the respective passage openings. In a further embodiment, the second particle detector may be disposed within the first objective lens 107 (illustrated using a dashed line and provided with reference sign 117' in FIG. 2), disposed between the tube electrode 113 and the individual electrode 112 (illustrated using a dashed line and provided with reference sign 117" in FIG. 2) and/or disposed, e.g., on the object side on the individual electrode 112 (illustrated using a dashed line and provided with the reference sign 117''' in FIG. 2). If reference is made to the second particle detector 117 below, this also applies accordingly to the second particle detectors 117' to 117'''.

The second particle detector 117 serves principally for detecting secondary electrons. Upon emerging from the object 114, the secondary electrons initially have a low kinetic energy and arbitrary directions of motion. By means of the strong extraction field emanating from the tube electrode 113, the secondary electrons may be accelerated in the direction of the first objective lens 107. The secondary electrons enter the first objective lens 107 approximately parallel. The beam diameter of the beam of the secondary electrons remains small in the first objective lens 107 as well. The first objective lens 107 then may have a strong effect on the secondary electrons and generates a comparatively short focus of the secondary electrons with sufficiently steep angles with respect to the optical axis OA, and so the secondary electrons diverge far apart from one another downstream of the focus and strike the second particle detector 117 on the active area thereof. By contrast, only a small proportion of electrons that are backscattered at the object 114, i.e., backscattered electrons, which have a relatively high kinetic energy in comparison with the secondary electrons upon emerging from the object 114, may be captured by the second particle detector 117. The high kinetic energy and the angles of the backscattered electrons with respect to the optical axis OA upon emerging from the object 114 may have the effect that a beam waist, i.e., a beam region having a minimum diameter, of the backscattered electrons lies in the vicinity of the second particle detector 117. A large portion of the backscattered electrons passes through the passage opening of the second particle detector 117. Therefore, the first particle detector 116 substantially serves to detect the backscattered electrons.

In a further embodiment of the electron beam column 100, the first particle detector 116 may additionally be embodied with an opposing field grid 116A. The opposing field grid 116A may be disposed on the side of the first particle detector 116 directed towards the object 114. With respect to the potential of the beam-guiding tube 104, the opposing field grid 116A may have a negative potential such that only backscattered electrons with a high energy pass through the opposing field grid 116A to the first particle detector 116. Additionally or alternatively, the second particle detector 117 has a further opposing field grid, which has an analogous embodiment to the aforementioned opposing field grid 116A of the first particle detector 116 and an analogous function.

The detector signals generated by the first particle detector 116 and the second particle detector 117 may be used to generate an image or images of the surface of the object 114.

Reference is explicitly made to the fact that the apertures of the first aperture unit 108 and of the second aperture unit 109, and the passage openings of the first particle detector 116 and of the second particle detector 117, are illustrated in exaggerated fashion. The passage openings of the first particle detector 116 and of the second particle detector 117 may have an extent perpendicular to the optical axis OA in the range of 0.5 mm to 5 mm. By way of example, they have a circular embodiment and a diameter in the range of 1 mm to 3 mm perpendicular to the optical axis OA.

The second aperture unit 109 may be configured as a pinhole aperture unit in the embodiment illustrated here and may be provided with a second aperture 118 for the passage of the primary electron beam, which may have an extent in the range from 5 µm to 500 µm, e.g. 35 µm. As an alternative thereto, provision is made in a further embodiment for the second aperture unit 109 to be provided with a plurality of apertures, which may be displaced mechanically with respect to the primary electron beam or which may be reached by the primary electron beam by the use of electrical and/or magnetic deflection elements. Reference is also made to the explanations provided above in respect of the second aperture unit 109. The second aperture unit 109 may be embodied as a pressure stage aperture unit. This separates a first region, in which the electron source 101 may be disposed and in which an ultra-high vacuum ($10^{-7}$ hPa to $10^{-12}$ hPa) prevails, from a second region, which may have a high vacuum ($10^{-3}$ hPa to $10^{-7}$ hPa). The second region may be the intermediate pressure region of the beam-guiding tube 104, which leads to the sample chamber 201.

The object 114 may be disposed on a sample stage 122. The sample stage 122 may be embodied to be movable in three directions disposed perpendicular to one another, namely in an x-direction, in a y-direction and in a z-direction. Moreover, the sample stage 122 may be rotated about two rotational axes which may be disposed perpendicular to one another.

The particle beam device 200 further may comprise a third particle detector 121 (cf. also FIG. 1), which may be disposed in the sample chamber 201. More precisely, the third particle detector 121 may be disposed behind the object 114, as seen from the electron source 101 along the optical axis OA. The primary electron beam passes through the object 114 to be examined. When the primary electron beam passes through the object 114 to be examined, the electrons of the primary electron beam interact with the material of the object 114 to be examined. The electrons passing through the object 114 to be examined may be detected by the third particle detector 121.

The particle beam device 200 may comprise a fourth particle detector, namely a chamber particle detector 134 (cf. also FIG. 1), which may be arranged in the sample chamber 201.

The first particle detector 116, the second particle detector 117, the third particle detector 121 and the chamber particle detector 134 may be connected to a control unit 123, which may have a monitor 124. The control unit 123 processes detector signals that may be generated by the first particle detector 116, the second particle detector 117, the third particle detector 121 and the chamber particle detector 134 and displays on the monitor 124 said detector signals in the form of images. Moreover, the control unit 123 may comprise a processor 130, loaded onto which there may be a computer program product with program code which controls the particle beam device 200 in such a way that an embodiment of the method according the system described herein is carried out. This will still be explained in more detail below.

The coil 111 of the first objective lens 107 may be line-connected to an objective lens control unit 125. The objective lens control unit 125 may be line-connected to the control unit 123. By means of the objective lens control unit 125, the objective lens excitation may be set, for example by setting an objective lens current and/or an objective lens voltage, which may be supplied to the coil 111, for example. As a result of this, it is possible to influence and set an electric field and/or magnetic field that is generated by the first objective lens 107. In one embodiment, the coil 111 may have two partial coils. These each may have a dedicated current supply in the objective lens control unit 125. By way of example, this obtains a variable magnetic field with a constant power loss in the partial coils.

The electron source 101 may be line-connected to an electron source control unit 126. The electron source 101, the suppressor electrode 101A and the extraction electrode 102 may be connected to the electron source control unit 126 and may be supplied with voltage by the electron source control unit 126.

The first deflection unit 131 and the second deflection unit 132 may be connected to a deflection control unit 133 and supplied with voltages and/or currents via the deflection control unit 133.

Further, the electron beam column 100 may comprise a third deflection unit 135, which may be connected to the deflection control unit 133 and which may be supplied with voltages and/or currents by the deflection control unit 133. In this embodiment, the third deflection unit 135 may be disposed in the region of the first objective lens 107. The third deflection unit 135 may be used to guide the secondary electrons, as will be explained in more detail below.

The electron beam column 100 may be disposed vertically in relation to the sample chamber 201. By contrast, the ion beam column 300 may be arranged inclined by an angle of approximately 50° in relation to the electron beam column 100. The ion beam column 300 may comprise a second beam generator in the form of an ion beam generator 301. Ions, which form a second particle beam in the form of an ion beam, are generated by the ion beam generator 301. The ions may be accelerated by means of an extraction electrode 302, which may be at a predeterminable potential. The second particle beam then passes through an ion optical unit of the ion beam column 300, wherein the ion optical unit may comprise a condenser lens 303 and a further objective lens, namely the second objective lens 304. The second objective lens 304 ultimately generates an ion probe, which may be focused on the object 114 arranged on the sample stage 122.

An adjustable aperture unit 306, a first electrode arrangement 307 and a second electrode arrangement 308 may be disposed above the second objective lens 304 (i.e., in the direction of the ion beam generator 301), wherein the first electrode arrangement 307 and the second electrode arrangement 308 may be embodied as scanning electrodes. The ion beam may be scanned over the surface of the object 114 by means of the first electrode arrangement 307 and the second electrode arrangement 308, with the first electrode arrangement 307 acting in a first direction and the second electrode arrangement 308 acting in a second direction, which is counter to the first direction. Thus, scanning may be carried out in an x-direction, for example. The scanning in a y-direction perpendicular thereto may be brought about by further electrodes (not illustrated), which may be rotated by 90°, at the first electrode arrangement 307 and at the second electrode arrangement 308.

The distances illustrated in FIG. 2 between the individual units of the particle beam device 200 are illustrated in exaggerated fashion in order to better illustrate the individual units of the combination device 200.

Figure 3:
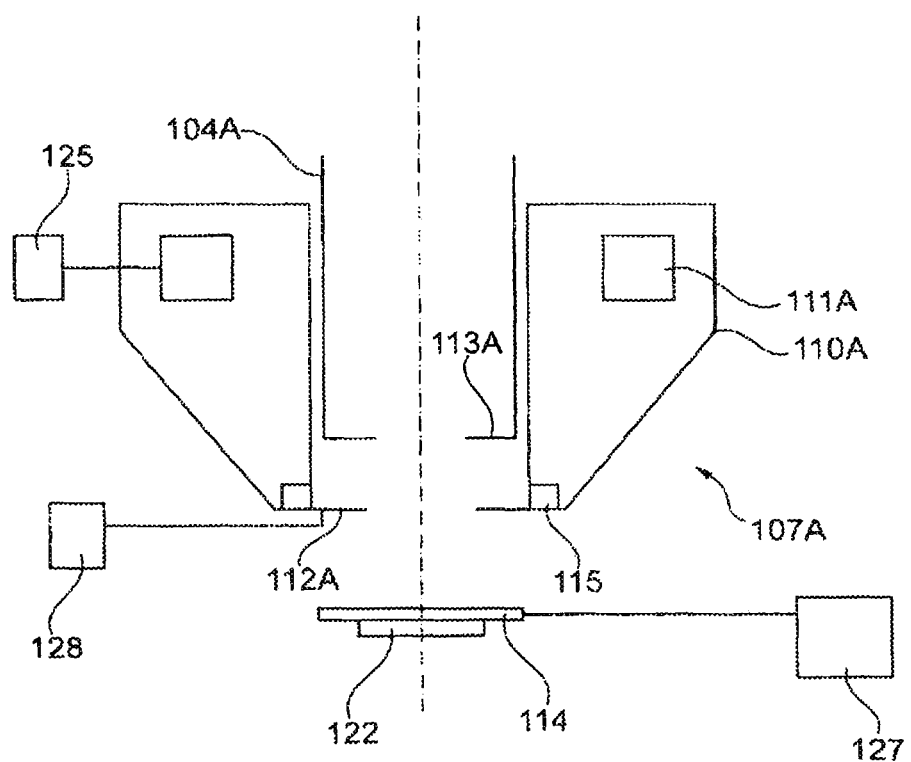
FIG. 3 shows a schematic illustration of an embodiment of a first objective lens.

FIG. 3 shows a further embodiment of a further first objective lens 107A, which may be provided for the electron beam column 100. The further first objective lens 107A may be based on the first objective lens 107 as per FIGS. 1 and 2. The further first objective lens 107A may have pole pieces 110A, in which a bore may be formed. A beam-guiding tube 104A may be guided through this bore. Furthermore, a coil 111A may be disposed in the pole pieces 110A. An electrostatic retardation device may be disposed in a lower region of the beam-guiding tube 104A. The latter may have an individual electrode 112A in the form of a termination electrode and a tube electrode 113A, which may be disposed within the pole pieces 110A. The individual electrode 112A may be disposed opposite to the object 114. The tube electrode 113A may be disposed at one end of the beam-guiding tube 104A, which faces the object 114. Together with the beam-guiding tube 104A, the tube electrode 113A may be at the potential of the anode 103, while the individual electrode 112A and the object 114 may be at a lower potential in relation to the potential of the anode 103. In this manner, the electrons of the primary electron beam may be decelerated to a desired energy which may be required for examining the object 114.

The further first objective lens 107A firstly generates a magnetic field. Secondly, there may be two electric fields, namely a first electric field between the individual electrode 112A and the tube electrode 113A, and a second electric field between the individual electrode 112A and the object 114. The individual electrode 112A may be aligned parallel to the tube electrode 113A.

The coil 111A of the further first objective lens 107A may be line-connected to the objective lens control unit 125. By means of the objective lens control unit 125, the objective lens excitation may be set, for example by setting the objective lens current and/or the objective lens voltage, which may be supplied to the coil 111A, for example. As a result of this, it is possible to influence and set the electric field and/or magnetic field that may be generated by the further first objective lens 107A. Moreover, provision is additionally or alternatively made, for example, for the individual electrode 112A to be line-connected to a termination electrode control unit 128, which supplies the individual electrode 112A with a termination electrode voltage. The termination electrode voltage, which may be supplied to the individual electrode 112A, may be set by means of the termination electrode control unit 128. In addition or as an alternative thereto, provision is made for the object 114 to be line-connected to an object voltage control unit 127 for supplying the object 114 with object voltage. The object voltage supplied to the object 114 may be set by means of the object voltage control unit 127.

Figure 4:
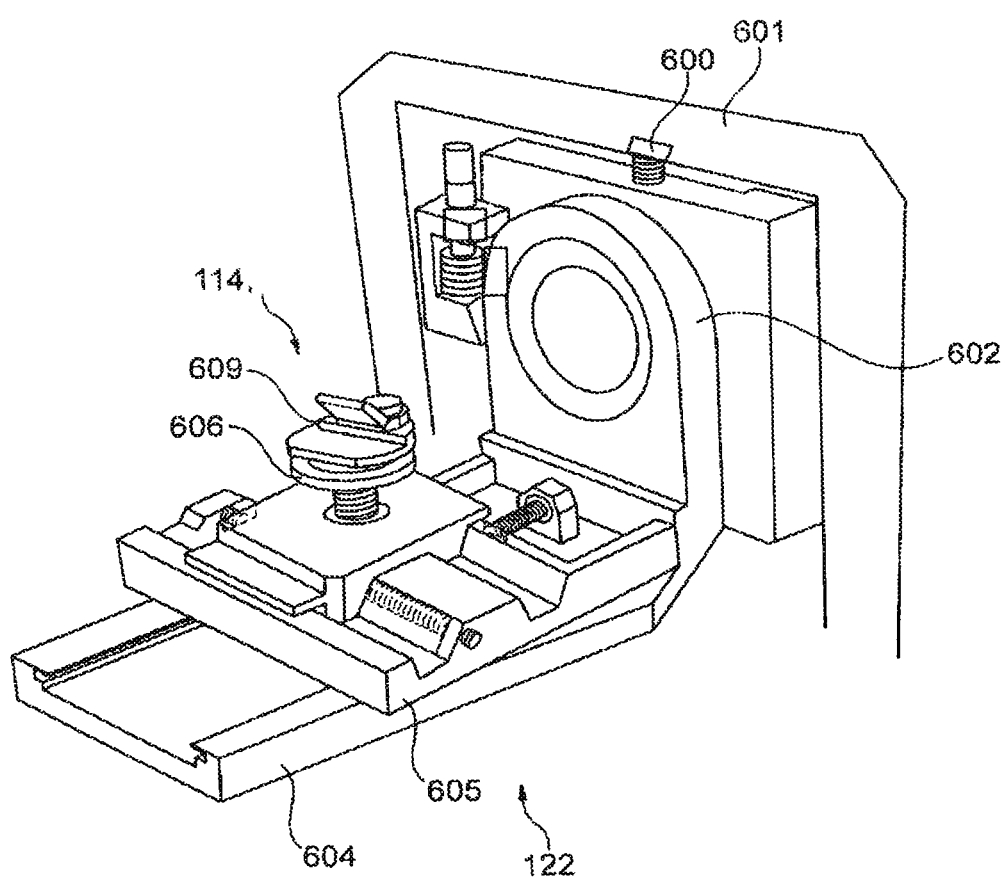
FIG. 4 shows a schematic illustration of an embodiment of a sample stage.

The sample stage 122 of the particle beam device 200 is considered below. The sample stage 122 may be embodied as a movable sample stage, which is illustrated schematically in FIGS. 4 and 5. Reference is made to the fact that the system described herein is not restricted to the sample stage 122 described here. Rather, the system described herein may have any movable sample stage that is suitable for the system described herein.

The object 114 may be disposed on the sample stage 122. The sample stage 122 may have movement elements that ensure a movement of the sample stage 122 in such a way that a region of interest on the object 114 may be examined by means of a particle beam. The movement elements are illustrated schematically in FIGS. 4 and 5 and are explained below.

The sample stage 122 may have a first movement element 600 at a housing 601 of the sample chamber 201, in which the sample stage 122 may be disposed. The first movement element 600 enables a movement of the sample stage 122 along the z-axis (third stage axis). Further, provision may be made of a second movement element 602. The second movement element 602 enables a rotation of the sample stage 122 about a first stage rotation axis 603, which also may be referred to as a tilt axis. This second movement element 602 serves to tilt the object 114 about the first stage rotation axis 603.

Disposed at the second movement element 602, in turn, may be a third movement element 604 that may be embodied as a guide for a carriage and that may ensure that the sample stage 122 is movable in the x-direction (first stage axis). The aforementioned slide may be a further movement element in turn, namely a fourth movement element 605. The fourth movement element 605 may be embodied in such a way that the sample stage 122 is movable in the y-direction (second stage axis). To this end, the fourth movement element 605 may have a guide in which a further carriage is guided, a holder 609 with the object 114 in turn may be disposed at the latter.

The holder 609 may be embodied, in turn, with a fifth movement element 606 that facilitates a rotation of the holder 609 about a second stage rotation axis 607. The second stage rotation axis 607 may be oriented perpendicular to the first stage rotation axis 603.

On account of the above-described arrangement, the sample stage 122 of the embodiment discussed here may have the following kinematic chain: first movement element 600 (movement along the z-axis)—second movement element 602 (rotation about the first stage rotation axis 603)—third movement element 604 (movement along the x-axis)—fourth movement element 605 (movement along the y-axis)—fifth movement element 606 (rotation about the second stage rotation axis 607).

In a further embodiment (not illustrated), provision is made for further movement elements to be disposed at the sample stage 122 such that movements along further translational axes and/or about further rotation axes are made possible.

Figure 5:
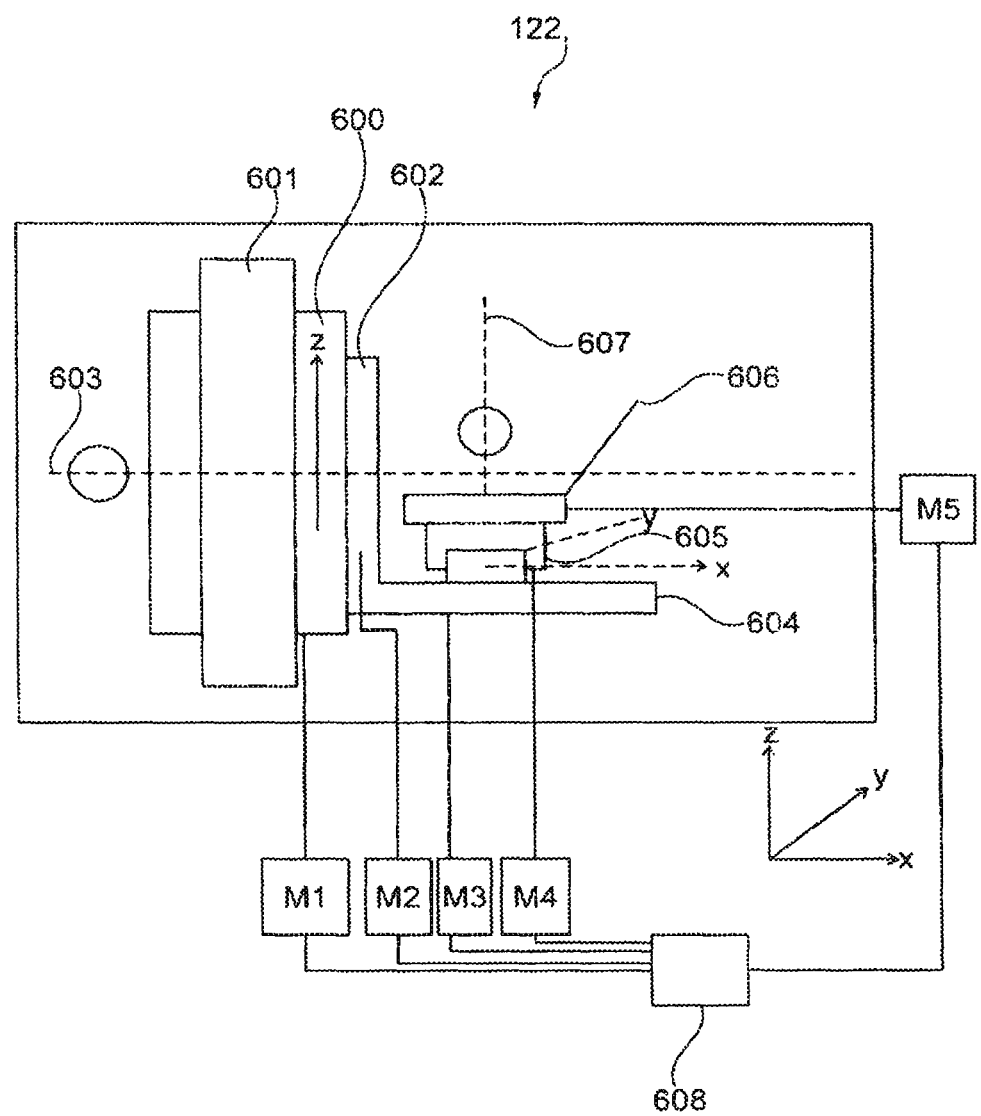
FIG. 5 shows a further schematic illustration of the sample stage according to FIG. 4.

It is clear from FIG. 5 that each of the aforementioned movement elements may be connected to a stepper motor. Thus, the first movement element 600 may be connected to a first stepper motor M1 and the former may be driven on account of a driving force that is provided by the first stepper motor M1. The second movement element 602 may be connected to a second stepper motor M2, which drives the second movement element 602. The third movement element 604 may be connected, in turn, to a third stepper motor M3. The third stepper motor M3 provides a driving force for driving the third movement element 604. The fourth movement element 605 may be connected to a fourth stepper motor M4, wherein the fourth stepper motor M4 drives the fourth movement element 605. Further, the fifth movement element 606 may be connected to a fifth stepper motor M5. The fifth stepper motor M5 provides a driving force that drives the fifth movement element 606. The aforementioned stepper motors M1 to M5 may be controlled by a control unit 608 (see FIG. 5).

Embodiments of the method according to the system described herein are now explained below.

In one embodiment of the method according to the system described herein, values of a control parameter that are used to drive the objective lens control unit 125 to set the objective lens excitation, for example by setting the objective lens current and/or the objective lens voltage of the first objective lens 107 or the further first objective lens 107A, are ascertained first. By way of example, the control parameter is a physical variable, in particular a control current or a control voltage, but also, e.g., the ratio of physical variables, in particular an amplification of physical variables. The values of the physical variables may be adjustable at the control unit 123 or using the control unit 123 and may be used to control and/or supply the objective lens control unit 125 in such a way that desired physical effects, for example, the generation of specific magnetic fields and/or electrostatic fields, are brought about.

Figure 6:
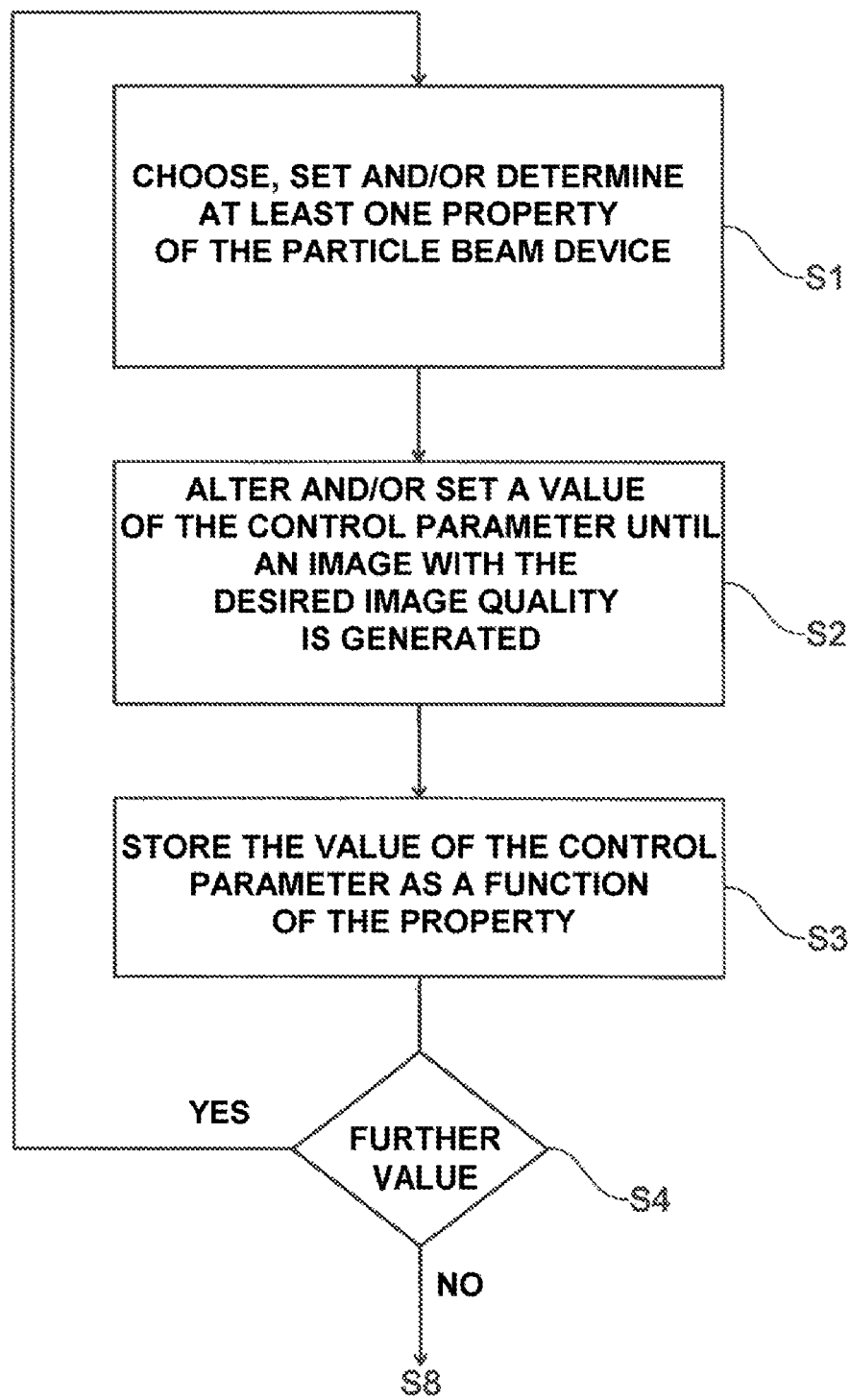
FIG. 6 shows a schematic illustration of a flowchart of a first embodiment of the method according to the system described herein.

FIG. 6 shows a flowchart of an embodiment for ascertaining the values of the control parameter. Initially, at least one of the following properties of the particle beam device 200 may be chosen, set and/or determined in a method step S1:

a rotation of the sample stage 122 on which the object 114 is disposed. By way of example, the rotational position of the sample stage 122 may be determined. In addition or as an alternative thereto, the rotation, and hence the rotational position, of the sample stage 122 is chosen, set and/or determined;

a distance between the object 114 and the first objective lens 107 or the further first objective lens 107A. This distance is the working distance. By way of example, the distance lies in the range from 0.3 mm to 20 mm or in the range from 0.5 mm to 12 mm. The range limits may be included in the predeterminable ranges. Reference is explicitly made to the fact that the aforementioned distance values should only be understood to be illustrative and not restrictive. Instead, other values for the distance also may be chosen;

a material of the object 114. Accordingly, the material which the object 114 consists of and/or from which it is composed may be determined or chosen;

a surface roughness of the object 114;

a landing energy of the ions of the ion beam on the object 114. The landing energy of the ions is the energy with which the object 114 is examined and/or imaged. The landing energy of the ions may differ from the energy with which the ions are guided through the ion beam column 300. By way of example, provision is made for initially accelerating the ions very strongly and only decelerating the latter to the landing energy just before incidence on the object 114. By way of example, the landing energy of the ions lies in the range between 1 eV and 30 keV;

an orientation of a surface of the object 114;

an acceleration voltage, with which the primary electron beam is guided within the electron beam column 100. By way of example, the acceleration voltage may be set using the electron source control unit 126.

The value of the control parameter may be altered and/or set in a further method step S2 until an image of the object 114 with a desired image quality is generated. To this end, the ion beam of the ion beam column 300 may be guided onto the object 114 in such a way that the ions of the ion beam interact with the material of the object 114. As a result of this, second interaction particles in the form of secondary electrons are generated, which may be detected by means of the second particle detector 117 of the electron beam column 100. The particle detector 117 generates corresponding detection signals which may be used to generate the image of the object 114. Thus, the value of the control parameter may be altered in the method step S2 for the purposes of driving and/or setting the objective lens excitation of the first objective lens 107 or the further first objective lens 107A of the electron beam column 100. By way of example, the image quality of the image of the object 114 may be determined by means of objective criteria. By way of example, the image quality of an image becomes better with increasing resolution in the image or with increasing contrast. Alternatively, the image quality may be determined on the basis of subjective criteria. Here, a user may determine individually as to whether or not an obtained image quality is sufficient. However, what may by all means occur in this case is that the image quality deemed sufficient by a first user is not considered sufficient by a second user. By way of example, the image quality of an image of the object 114 also may be determined on the basis of the signal-to-noise ratio of the detection signal. The image quality may not be sufficiently good in the case of a signal-to-noise ratio in the range from 0 to 5. By way of example, if the signal-to-noise ratio lies in the range from 20 to 40, this may be referred to as a good signal-to-noise ratio (and hence also a good and sufficient image quality). The direction of the beam of the second interaction particles in the form of the secondary electrons also may be a measure for the image quality. The second interaction particles in the form of the secondary electrons may be emitted from the object 114 at different solid angles. The direction of the beam of these secondary electrons (i.e., the solid angle through which the beam of the secondary electrons extends) may additionally be influenced by tilting the ion beam and/or the object 114 in relation to the optical axis of the ion beam column 300. As a result of this, it is possible, firstly, to choose the direction of the beam of the second interaction particles in the form of the secondary electrons in such a way that these secondary electrons are incident on the second particle detector 117. Secondly, the number of secondary electrons generated may be influenced by the aforementioned tilt. By way of example, if the ion beam is incident into the object 114 parallel to a crystal lattice of the object 114, the number of second interaction particles in the form of secondary electrons reduces. The detection signals attenuate. This leads to a reduction in the image quality. It may be possible to increase the number of second interaction particles in the form of the secondary electrons by setting the tilt of the ion beam. Using such a setting, it may be possible to differentiate crystals with a first orientation from crystals with a second orientation on the basis of the strength of the detection signals.

Further, the value of the control parameter in which the image generated by the detection of the second interaction particles in the form of the secondary electrons generated upon incidence of the ion beam on the object 114 has the desired image quality may be stored in a method step S3 in a data storage unit 136 of the control unit 123 as a function of the chosen, set and/or determined aforementioned at least one property, i.e., the rotation of the sample stage 122 on which the object 114 is disposed, the working distance, the material of the object 114, the surface roughness of the object 114, the landing energy of the ions of the ion beam on the object 114, the orientation of the surface of the object 114 and the acceleration voltage, with which the primary electron beam may be guided within the electron beam column 100. It is explicitly noted that the system described herein is not limited to aforementioned properties. Rather, any property of the particle beam device 200 that is suitable for carrying out an embodiment of the method according the system described herein may be used for the system described herein.

In method step S4, there may be a query as to whether a further value of the control parameter should be ascertained. If a further value of the control parameter should be ascertained, method steps S1 to S4 may be run through again. Accordingly, numerous values of the control parameter may be ascertained multiple times in succession in this embodiment of the method according to the system described herein, with each value of the control parameter being ascertained in the case of different properties of the particle beam device 200. In this way, the value of the control parameter with which the objective lens excitation of the first objective lens 107 or the further first objective lens 107A of the electron beam column 100 may be driven and set to obtain the desired or sufficient image quality is obtained for each property of the particle beam device 200.

If no further value of the control parameter should be ascertained, method step S8, which will be discussed in more detail below, may be carried out after method step S4 has been carried out.

Figure 7:
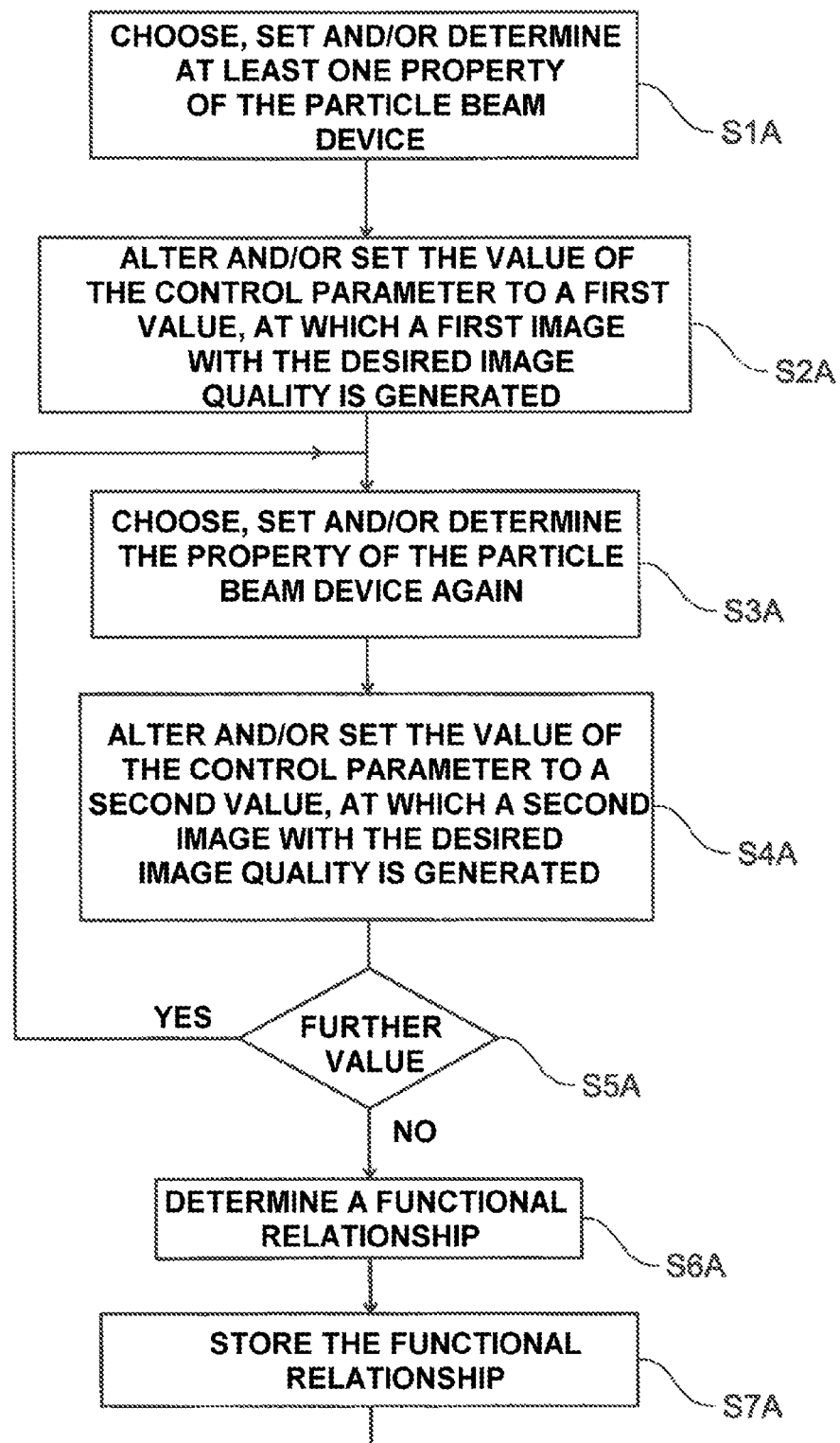
FIG. 7 shows a schematic illustration of a flowchart of a second embodiment of the method according to the system described herein.

FIG. 7 shows a flowchart of a further embodiment for ascertaining the values of the control parameter. In this further embodiment of the method according to the system described herein, provision is made for a functional relationship to be determined, which may be used to calculate the value of the control parameter in the control unit 123. Initially, at least one of the following properties of the particle beam device 200 may be chosen, set and/or determined in a method step S1A in this further embodiment:

the rotation of the sample stage 122 on which the object 114 is disposed. What was stated above in respect of the sample stage 122 also applies in this case;

the distance between the object 114 and the first objective lens 107 or further first objective lens 107A. What was stated above in respect of the distance also applies in this case;

the material of the object 114. What was stated above in respect of the material also applies in this case;

the surface roughness of the object 114;

the landing energy of the ions of the ion beam on the object 114. What was stated above in respect of the landing energy also applies in this case;

the orientation of the surface of the object 114;

the acceleration voltage, with which the primary electron beam is guided within the electron beam column 100. What was stated above in respect of the acceleration voltage also applies in this case.

The value of the control parameter may be set and/or altered in a method step S2A to a first value at which an image of the object 114 (a first image) is obtained with a desired image quality. To this end, the ion beam of the ion beam column 300 may be guided onto the object 114 in such a way that the ions of the ion beam interact with the material of the object 114. As a result of this, second interaction particles in the form of secondary electrons are generated, which may be detected by means of the second particle detector 117 of the electron beam column 100. The second particle detector 117 generates corresponding detection signals which may be used to generate the image of the object 114. In method step S2A, the value of the control parameter may be altered and/or set to the first value for the purposes of driving and/or setting the objective lens excitation, for example by setting the objective lens current and/or the objective lens voltage of the first objective lens 107 or of the further first objective lens 107A of the electron beam column 100. What was stated above in respect of the image quality also applies in this case.

Moreover, in the further embodiment of the method according to the system described herein, the at least one property of the particle beam device previously chosen, set and/or determined in method step S1A may be yet again chosen, set and/or determined in a method step S3A:
- the rotation of the sample stage 122 on which the object 114 is disposed. What was stated above in respect of the sample stage 122 also applies in this case;
- the distance between the object 114 and the first objective lens 107 or the further first objective lens 107A. What was stated above in respect of the distance also applies in this case;
- the material of the object 114. What was stated above in respect of the material also applies in this case;
- the surface roughness of the object 114;
- the landing energy of the ions of the ion beam on the object 114. What was stated above in respect of the landing energy also applies in this case;
- the orientation of the surface of the object 114;
- the acceleration voltage, with which the primary electron beam is guided within the electron beam column 100. What was stated above in respect of the acceleration voltage also applies in this case.

Further, the value of the control parameter may be set and/or altered in a method step S4A to a second value at which an image of the object 114 (a second image) is obtained with the desired image quality. To this end, the ion beam of the ion beam column 300 may be guided onto the object 114 in such a way that the ions of the ion beam interact with the material of the object 114. As a result of this, second interaction particles in the form of secondary electrons are generated, which may be detected by means of the second particle detector 117 of the electron beam column 100. The second particle detector 117 generates corresponding detection signals which may be used to generate the image of the object 114. In method step S4A, the value of the control parameter may be altered and/or set to the second value for the purposes of driving and/or setting the objective lens excitation, for example by setting the objective lens current and/or the objective lens voltage of the first objective lens 107 or of the further first objective lens 107A of the electron beam column 100. What was stated above in respect of the image quality also applies in this case.

In method step S5A, there may be a query as to whether a further value of the control parameter should be ascertained. If a further value of the control parameter should be ascertained, method steps S3A to S5A may be run through again. By way of example, a third value of the control parameter is ascertained as a function of at least one of the aforementioned properties, in which the image quality of an image generated by the ion beam is sufficiently good or as desired. Accordingly, numerous values of the control parameter may be ascertained multiple times in succession in this embodiment of the method according to the system described herein, with each value of the control parameter being ascertained in the case of different properties of the particle beam device 200. In this way, the value of the control parameter with which the objective lens excitation of the first objective lens 107 or the further first objective lens 107A of the electron beam column 100—as already explained above—may be driven and set to obtain the desired or sufficient image quality is obtained for each property of the particle beam device 200.

If the result of the query in method step S5A is that no further value of the control parameter should be ascertained, a functional relationship may be determined in method step S6A between the ascertained values, for example between the first value of the control parameter, the second value of the control parameter and the third value of the control parameter. This is now explained on the basis of FIG. 8.

Figure 8:
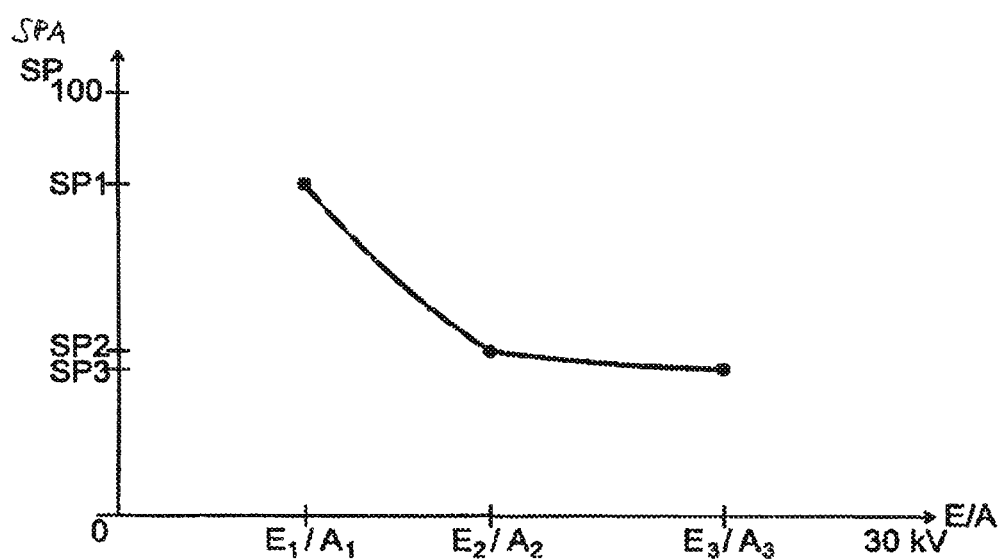
FIG. 8 shows a schematic illustration of values of a control parameter as a function of properties of the particle beam device.

FIG. 8 shows the dependence of the control parameter, which is denoted by SP in FIG. 8, for example as a function of two properties of the particle beam device 200, a first property of the particle beam device 200 being denoted by E and a second property of the particle beam device 200 being denoted by A. The first property E and the second property A may be different properties. Further, the first property E and the second property A are, for example, the rotation of the sample stage 122 on which the object 114 is disposed, the working distance, the material of the object 114, the surface roughness of the object 114, the landing energy of the ions of the ion beam on the object 114, the orientation of the surface of the object 114 and the acceleration voltage, with which the primary electron beam is guided within the electron beam column 100.

Three images with a sufficiently good image quality were generated in the embodiment according to FIG. 8. For a first value E1 of the first property E and a first value A1 of the second property A, a first control parameter value SP1 of the control parameter SP was ascertained for a first image which has a sufficiently good image quality. Further, for a second value E2 of the first property E and a second value A2 of the second property A, a second control parameter value SP2 of the control parameter SP was ascertained for a second image which has a sufficiently good image quality. Moreover, for a third value E3 of the first property E and a third value A3 of the second property A, a third control parameter value SP3 of the control parameter SP was ascertained for a third image which has a sufficiently good image quality.

Now, a functional relationship may be ascertained between the first control parameter value SP1, the second control parameter value SP2 and the third control parameter value SP3 as a function of the first property E and the second property A. The functional relationship may be a linear relationship or a nonlinear relationship. A step function may by all means also be comprised by the functional relationship or forms the functional relationship. By way of example, the functional relationship may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, provision is made for the functional relationship to be determined by an extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the first value and the second value.

The determined functional relationship may be stored in the data storage unit 136 in method step S7A.

Figure 9:
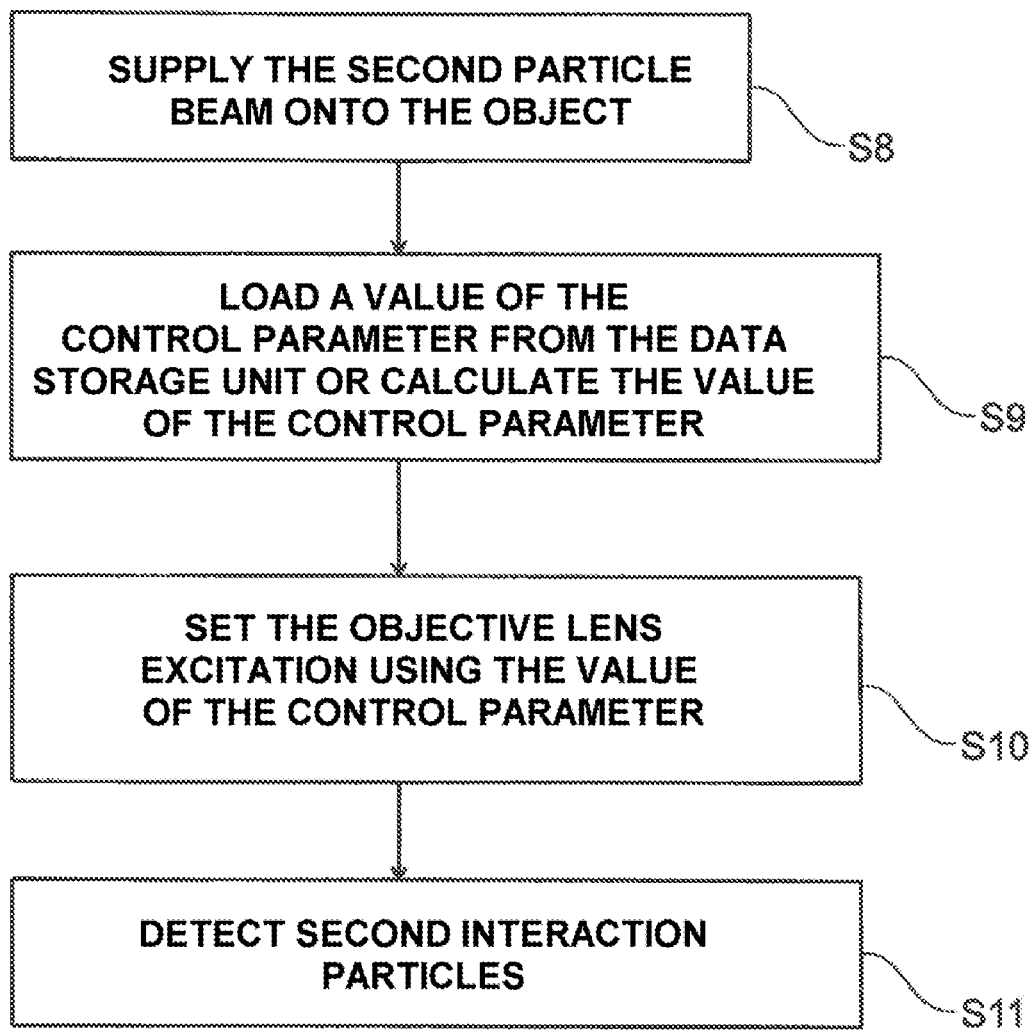
FIG. 9 shows a schematic illustration of a flowchart of a third embodiment of the method according to the system described herein.

FIG. 9 shows further method steps of an embodiment of the method according the system described herein. In method step S8, the ion beam may be guided onto the object 114 using the ion beam column 300. By way of example, the ion beam may be focused onto the object 114 using the second objective lens 304 of the ion beam column 300. Further, in method step S9, a value of the control parameter SP may be loaded into the control unit 123 from the data storage unit 136 as a function of the present properties of the particle beam device 200. The loaded value of the control parameter SP may be the value of the control parameter that was ascertained previously and for which the image quality of an image generated by the ion beam is sufficiently good or as desired. As an alternative thereto, the value of the control parameter SP is calculated in the control unit 123 using the determined functional relationship as a function of the present properties of the particle beam device 200. The calculated value of the control parameter SP may be the value for which the image quality of an image generated by the ion beam is sufficiently good or as desired.

The objective lens excitation may be set in method step S10, for example by setting the objective lens current and/or the objective lens voltage of the first objective lens 107 or of the further first objective lens 107A of the electron beam column 100 using the value of the control parameter SP loaded from the data storage unit 136 or calculated by the control unit 123. Further, second interaction particles in the form of the secondary electrons may be detected in method step S11 using the second particle detector 117, which may be disposed in the region between the first objective lens 107 or the further first objective lens 107A and the first beam generator 101 of the electron beam column 100, wherein the secondary electrons emerge from an interaction of the ion beam with the object 114 upon incidence of the ion beam on the object 114.

In the case of a particle beam device 200 with the electron beam column 100 and the ion beam column 300, an embodiment of the system described herein allows images with a good and/or desired quality to be generated by the second particle detector 117 by way of the detection of secondary electrons, which arise on account of the interaction of the ion beam with the object 114. The value of the control parameter SP may be loaded from the data storage unit 136 or calculated in the control unit 123 and used to drive the objective lens excitation of the first objective lens 107 or of the further first objective lens 107A of the electron beam column 100 in such a way that sufficiently many of the second interaction particles in the form of the secondary electrons and/or the second interaction particles in the form of the secondary electrons from a desired angular range may be guided from the object 114 to the second particle detector 117. Consequently, the value of the control parameter SP for driving the first objective lens 107 or the further first objective lens 107A of the electron beam column 100 may not remain at a value which is used for supplying the primary electron beam of the electron beam column 100 onto the object 114; instead, the objective lens excitation of the first objective lens 107 or the further first objective lens 107A of the electron beam column 100 may be driven in such a way that sufficiently many of the second interaction particles in the form of the secondary electrons and/or the second interaction particles in the form of the secondary electrons from a desired angular range reach, e.g., through the first objective lens 107 or the further first objective lens 107A to the second particle detector 117, which may be disposed between the first objective lens 107 or the further first objective lens 107A and the electron source 101. In addition or as an alternative thereto, the secondary electrons reach at least one of the second particle detectors 117' to 117'''.

Figure 10:
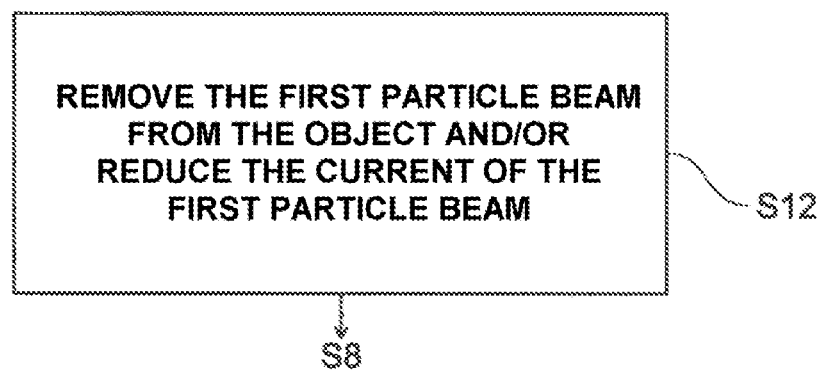
FIG. 10 shows a schematic illustration of a flowchart of a fourth embodiment of the method according to the system described herein.

FIG. 10 shows a further embodiment of the method according to the system described herein. In this further embodiment of the method according to the system described herein, method step S12 as per FIG. 10 may be carried out before method step S8 as per FIG. 9. If the object 114 is, e.g., imaged and/or analyzed using the primary electron beam of the electron beam column 100, the primary electron beam guided to the object 114 using the electron beam column 100 may be removed from the object 114 in method step S12, for example. By way of example, the removal of the primary electron beam from the object 114 is carried out temporally before supplying and/or while supplying the ion beam onto the object 114. If the removal of the primary electron beam from the object 114 is implemented temporally before the supply of the ion beam onto the object 114, only the ion beam (i.e., the second particle beam) may be supplied to the object 114 when method steps S8 to S11 as per FIG. 9 may be carried out. By way of example, removing the primary electron beam may comprise at least one of the following steps: (i) guiding the primary electron beam away from the object 114 using the first deflection unit 131 and/or the second detection unit 132, (ii) masking the primary electron beam by moving an aperture unit, for example the first aperture unit 108 and/or the second aperture unit 109, (iii) deactivating the electron source control unit 126 of the electron beam column 100 in such a way that the primary electron beam is not generated or operating the electron source control unit 126 in such a way that the primary electron beam is not sufficiently generated so that first interaction particles generated by the incidence of the primary electron beam on the object 114 are not detected by the second particle detector 117, (iv) guiding the primary electron beam away from the object 114 using the scanning apparatus 115 and (v) changing an excitation of the first condenser lens 105 and/or the second condenser lens 106.

Method step S8 may be carried out after method step S12 has been carried out.

In a further embodiment of the method according to the system described herein, the aforementioned control parameter is a first control parameter and a second control parameter is used to drive and/or set the third deflection unit 135 by means of the deflection control unit 133 in order to further improve the quality of an image of the object 114, which may be generated by the secondary electrons generated upon incidence of the ion beam on the object 114. In this embodiment of the method according to the system described herein, values of the second control parameter, which may be used to drive and/or set the third deflection unit 135 by means of the deflection control unit 133, may be ascertained first. By way of example, the second control parameter is also a physical variable, in particular a control current or a control voltage, but also, e.g., the ratio of physical variables, in particular an amplification of physical variables. The values of the physical variables may be adjustable at the control unit 123 or using the control unit 123 and may be used to control and/or supply the deflection control unit 133 in such a way that desired physical effects, for example the generation of specific magnetic fields and/or electrostatic fields, are brought about.

The values of the second control parameter may be ascertained, for example, in analogous fashion to the embodiment of the method according to the system described herein illustrated in FIG. 6. Initially, at least one of the following properties of the particle beam device 200 may be chosen, set and/or determined in a method step S1:

- the rotation of the sample stage 122 on which the object 114 is disposed. What was stated further above in respect of the rotation also applies in this case;
- the distance between the object 114 and the first objective lens 107 or the further first objective lens 107A, i.e., the working distance. What was stated further above applies in respect of the distance;
- the material of the object 114. What was stated further above applies in respect of the material;
- the surface roughness of the object 114;
- the landing energy of the ions of the second ion beam on the object 114. What was stated further above applies in respect of the landing energy;
- the orientation of the surface of the object 114;
- the acceleration voltage, with which the primary electron beam is guided within the electron beam column 100. What was stated further above applies in respect of the acceleration voltage.

The value of the second control parameter may be altered and/or set in a further method step S2 until an image of the object 114 with a desired image quality is generated. To this end, the ion beam of the ion beam column 300 may be guided onto the object 114 in such a way that the ions of the ion beam interact with the material of the object 114. As a result of this, second interaction particles in the form of secondary electrons are generated, which may be detected by means of the second particle detector 117 of the electron beam column 100. The second particle detector 117 generates corresponding detection signals which may be used to generate the image of the object 114. The value of the second control parameter, which may be used to drive and/or set the third deflection unit 135 by means of the deflection control unit 133 of the electron beam column 100, may be altered in method step S2.

By way of example, the image quality of the image of the object 114 may be determined by means of the objective criteria. By way of example, the image quality of an image becomes better with increasing resolution in the image or with increasing contrast. Alternatively, the image quality may be determined on the basis of subjective criteria. Here, a user may determine individually whether or not an obtained image quality is sufficient. However, what may by all means occur in this case is that the image quality deemed sufficient by a first user is not considered sufficient by a second user. By way of example, the image quality of an image of the object 114 also may be determined on the basis of the signal-to-noise ratio of the detection signal. The image quality may not be sufficiently good in the case of a signal-to-noise ratio in the range from 0 to 5. By way of example, if the signal-to-noise ratio lies in the range from 20 to 40, this is referred to as a good signal-to-noise ratio (and hence also a good and sufficient image quality). The direction of the beam of the second interaction particles in the form of the secondary electrons also may be a measure for the image quality. The second interaction particles in the form of secondary electrons may be emitted from the object 114 at different solid angles. The direction of the beam of the secondary interaction particles in the form of the secondary electrons (i.e., the solid angle through which the beam of these secondary electrons extends) may additionally be influenced by tilting the ion beam and/or the object 114 in relation to the optical axis of the ion beam column 300. As a result of this, it is possible, firstly, to choose the direction of the beam of these secondary electrons in such a way that these secondary electrons are incident on the second particle detector 117. Secondly, the number of these generated secondary electrons may be influenced by the aforementioned tilt.

Further, the value of the second control parameter in which the image generated by the detection of the second interaction particles in the form of the secondary electrons generated upon incidence of the ion beam on the object 114 has the desired image quality may be stored in a method step S3 in the data storage unit 136 as a function of the chosen, set and/or determined aforementioned at least one property, i.e., the rotation of the sample stage 122 on which the object 114 is disposed, the working distance, the material of the object 114, the surface roughness of the object 114, the landing energy of the ions of the ion beam on the object 114, the orientation of the surface of the object 114 and the acceleration voltage, with which the primary electron beam is guided within the electron beam column 100. It is explicitly noted that the system described herein is not limited to the aforementioned properties. Rather, any property of the particle beam device 200 that is suitable for carrying out an embodiment of the method according the system described herein may be used for the system described herein.

In method step S4, there may be a query as to whether a further value of the second control parameter should be ascertained. If a further value of the second control parameter should be ascertained, method steps S1 to S4 may be run through again. Accordingly, numerous values of the second control parameter may be ascertained multiple times in succession in this embodiment of the method according to the system described herein, with each value of the second control parameter being ascertained in the case of different properties of the particle beam device 200. In this way, the value of the second control parameter with which the third deflection unit 135 is driven and/or set by means of the deflection control unit 133 to obtain the desired or sufficient image quality may be obtained for each property of the particle beam device 200.

If no further value of the second control parameter should be ascertained, method step S8 may be carried out after method step S4 has been carried out.

In a further embodiment of the method according to the system described herein, the aforementioned functional relationship may be a first functional relationship and values of the second control parameter may be ascertained in analogous fashion to the embodiment of the method according to the system described herein as per FIG. 7. In this further embodiment of the method according to the system described herein, provision is made for a second functional relationship to be determined, which may be used to calculate the value of the second control parameter in the control unit 123. Initially, at least one of the following properties of the particle beam device 200 may be chosen, set and/or determined in a method step S1A in this further embodiment:

- the rotation of the sample stage 122 on which the object 114 is disposed. What was stated above in respect of the sample stage 122 also applies in this case;

the distance between the object 114 and the first objective lens 107 or further first objective lens 107A. What was stated above in respect of the distance also applies in this case;

the material of the object 114. What was stated above in respect of the material also applies in this case;

the surface roughness of the object 114;

the landing energy of the ions of the ion beam on the object 114. What was stated above in respect of the landing energy also applies in this case;

the orientation of the surface of the object 114;

the acceleration voltage, with which the primary electron beam is guided within the electron beam column 100. What was stated above in respect of the acceleration voltage also applies in this case.

The value of the second control parameter may be set and/or altered in a method step S2A to a first value at which an image of the object 114 is obtained with a desired image quality. To this end, the ion beam of the ion beam column 300 may be guided onto the object 114 in such a way that the ions of the ion beam interact with the material of the object 114. As a result of this, second interaction particles in the form of secondary electrons are generated, which may be detected by means of the second particle detector 117 of the electron beam column 100. The second particle detector 117 generates corresponding second detection signals which may be used to generate the image of the object 114. The value of the second control parameter, which may be used to drive and/or set the third deflection unit 135 by means of the deflection control unit 133 of the electron beam column 100, may be set to the first value in method step S2A. What was stated above in respect of the image quality also applies in this case.

Moreover, in the further embodiment of the method according to the system described herein, the at least one property of the particle beam device 200 previously chosen, set and/or determined may be yet again chosen, set and/or determined in a method step S3A:

the rotation of the sample stage 122 on which the object 114 is disposed. What was stated above in respect of the sample stage 122 also applies in this case;

the distance between the object 114 and the first objective lens 107 or the further first objective lens 107A. What was stated above in respect of the distance also applies in this case;

the material of the object 114. What was stated above in respect of the material also applies in this case;

the surface roughness of the object 114;

the landing energy of the ions of the ion beam on the object 114. What was stated above in respect of the landing energy also applies in this case;

the orientation of the surface of the object 114;

the acceleration voltage, with which the primary electron beam is guided within the electron beam column 100. What was stated above in respect of the acceleration voltage also applies in this case.

Further, the value of the second control parameter may be set and/or altered in a method step S4A to a second value at which an image of the object 114 is obtained with a desired image quality. To this end, the ion beam of the ion beam column 300 may be guided onto the object 114 in such a way that the ions of the ion beam interact with the material of the object 114. As a result of this, second interaction particles in the form of secondary electrons are generated, which may be detected by means of the second particle detector 117 of the electron beam column 100. The second particle detector 117 generates corresponding second detection signals which may be used to generate the image of the object 114. The value of the second control parameter used to drive and/or set the third deflection unit 135 by means of the deflection control unit 133 may be altered and/or set to the second value in method step S4A. What was stated above in respect of the image quality also applies in this case.

In method step S5A, there may be a query as to whether a further value of the second control parameter should be ascertained. If a further value of the second control parameter should be ascertained, method steps S3A to S5A may be run through again. By way of example, a third value of the second control parameter may be ascertained as a function of at least one of the aforementioned properties, in which the image quality of an image generated by the ion beam is sufficiently good or as desired. Accordingly, numerous values of the second control parameter may be ascertained multiple times in succession in this embodiment of the method according to the system described herein, with each value of the second control parameter being ascertained in the case of different properties of the particle beam device 200. In this way, the value of the second control parameter with which the third deflection unit 135 is driven and/or set by means of the deflection control unit 133 may be obtained for each property of the particle beam device 200.

If the result of the query in method step S5A is that no further value of the second control parameter should be ascertained, a functional relationship may be determined in method step S6A between the ascertained values, for example between the first value of the second control parameter, the second value of the second control parameter and the third value of the second control parameter. This may be implemented in analogous fashion to the explanations provided above in relation to FIG. 8. FIG. 8 shows the dependence of the second control parameter, which is denoted by SPA in FIG. 8, for example as a function of two properties of the particle beam device 200, a first property of the particle beam device 200 being denoted by E and a second property of the particle beam device 200 being denoted by A. The first property E and the second property A may be different properties. Further, the first property E and the second property A are, for example, the rotation of the sample stage 122 on which the object 114 is disposed, the working distance, the material of the object 114, the surface roughness of the object 114, the landing energy of the ions of the ion beam on the object 114, the orientation of the surface of the object 114 and the acceleration voltage, with which the primary electron beam is guided within the electron beam column 100.

Three images with a sufficiently good image quality were generated in the embodiment according to FIG. 8. For a first value E1 of the first property E and a first value A1 of the second property A, a first value SP1 of the second control parameter SPA was ascertained for a first image which has a sufficiently good image quality. Further, for a second value E2 of the first property E and a second value A2 of the second property A, a second value SP2 of the second control parameter SPA was ascertained for a second image which has a sufficiently good image quality. Moreover, for a third value E3 of the first property E and a third value A3 of the second property A, a third value SP3 of the second control parameter SPA was ascertained for a third image which has a sufficiently good image quality.

Now, a second functional relationship may be ascertained between the first value SP1, the second value SP2 and the third value SP3 as a function of the first property E and the second property A. The second functional relationship may be a linear relationship or a nonlinear relationship. A step function may by all means also be comprised by the functional relationship or forms the second functional relationship. By way of example, the second functional relationship may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, provision is made for the second functional relationship to be determined by an extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the second functional relationship may be determined by forming an average, ascertaining random values and/or determining the smallest value or the largest value from the set of the first value and the second value. The determined second functional relationship may be stored in the data storage unit 136 in method step S7A.

Figure 11:
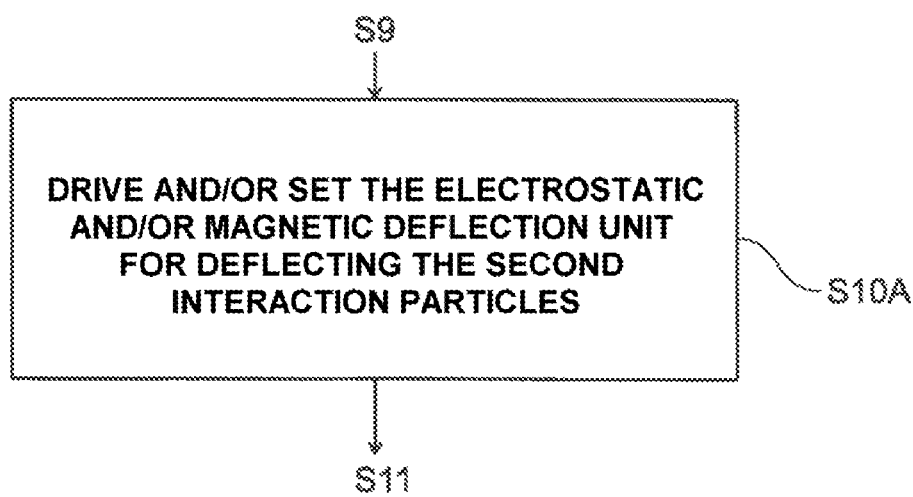
FIG. 11 shows a schematic illustration of a flowchart of a fifth embodiment of the method according to the system described herein.

Further method steps, in which the second control parameter SPA is used, may be carried out with the embodiment as per FIG. 11. The embodiment of the method according to the system described herein in FIG. 11 is based on the embodiment of the method according to the system described herein as per FIG. 9. The embodiment of FIG. 11 has analogous method steps to the embodiment of FIG. 9, with the difference that the embodiment of the method according to the system described herein as per FIG. 11 has method step S10A instead of method step S10. Thus, in method step S8, the ion beam may be guided onto the object 114 using the ion beam column 300. By way of example, the ion beam is focused onto the object 114 using the second objective lens 304 of the ion beam column 300. Further, in method step S9, a value of the second control parameter SPA may be loaded into the control unit 123 from the data storage unit 136 as a function of the present properties of the particle beam device 200. The loaded value of the second control parameter SPA may be the value of the second control parameter that was ascertained previously and for which the image quality of an image generated by the ion beam is sufficiently good or as desired. As an alternative thereto, the value of the second control parameter SPA may be calculated in the control unit 123 using the determined second functional relationship as a function of the present properties of the particle beam device 200. The calculated value of the second control parameter SPA may be the value for which the image quality of an image generated by the ion beam is sufficiently good or as desired.

The third deflection unit 135 may be driven and/or set in method step S10A by means of the deflection control unit 133 using the value of the second control parameter SPA, which may be loaded from the data storage unit 136 or calculated using the control unit 123. Further, second interaction particles in the form of the secondary electrons may be detected in method step S11 using the second particle detector 117, which may be disposed in the region between the first objective lens 107 or the further first objective lens 107A and the first beam generator 101 of the electron beam column 100, wherein the secondary electrons emerge from an interaction of the ion beam with the object 114 upon incidence of the ion beam on the object 114.

Figure 12:
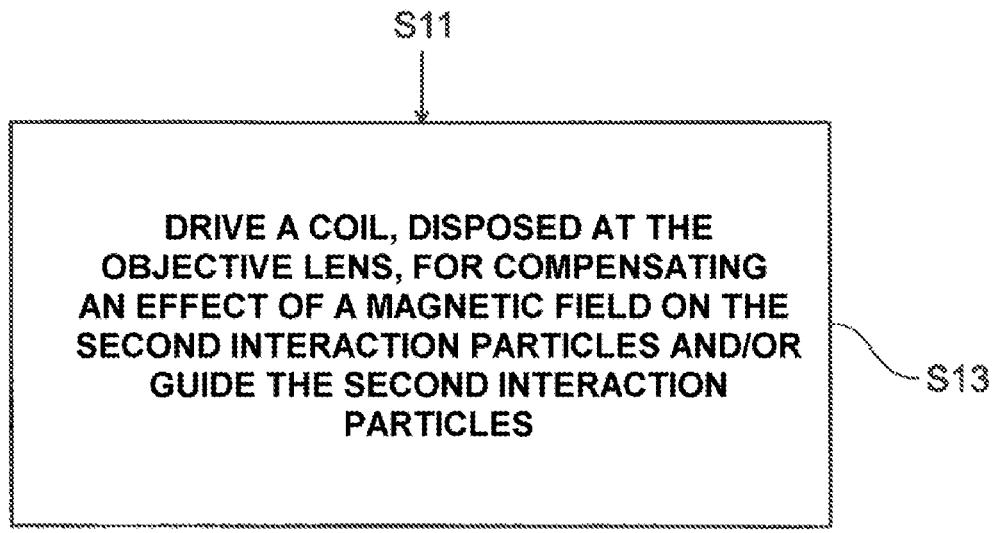
FIG. 12 shows a schematic illustration of a flowchart of a sixth embodiment of the method according to the system described herein.

FIG. 12 shows a further embodiment of the method according to the system described herein, in which provision is made for the additional coil 137, which may be disposed at the first objective lens 107 of the electron beam column 100, to be driven for the purposes of generating a magnetic field, wherein an effect of a magnetic field, generated by the first objective lens 107, on the ion beam and/or on the secondary electrons generated by the ion beam may be compensated at least in part (method step S13). In addition or as an alternative thereto, the second interaction particles in the form of the secondary electrons are guided on account of the magnetic field of the coil 137. This may improve the detection efficiency of the second particle detector 117 in respect of the aforementioned secondary electrons. By way of example, method step S13 is carried out after method step S11.

Figure 13:
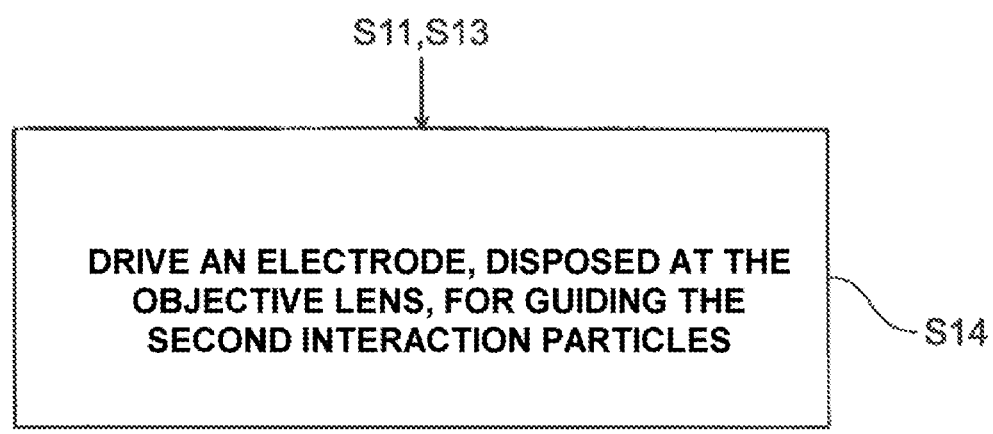
FIG. 13 shows a schematic illustration of a flowchart of a seventh embodiment of the method according to the system described herein.

FIG. 13 shows a further embodiment of the method according to the system described herein, in which provision is made for the individual electrode 112A, which may be disposed at the further first objective lens 107A, to be driven for the purposes of guiding the second interaction particles in the form of secondary electrons in the further first objective lens 107A (method step S14). This also improves the detection efficiency of the second particle detector 117 in respect of the aforementioned secondary electrons. By way of example, method step S14 is carried out after method step S11 or S13.

The features of the system described herein, including those features illustrated in the drawings and recited in the claims may be essential for the realization of the system described herein in the various embodiments thereof, both individually and in arbitrary combinations. The invention is not restricted to the described embodiments of the system described herein. It may be varied within the scope of the claims and taking into account the knowledge of the relevant person skilled in the art. Embodiments of the invention will be apparent to those skilled in the art from a consideration of the specification and/or an attempt to put into practice the system described herein. It is intended that the specification and examples be considered as illustrative examples only, with the true scope and spirit of the invention being indicated by the following claims.

The invention claimed is:

1. A method for operating a particle beam device, wherein the particle beam device includes a first particle beam column for providing a first particle beam and a second particle beam column for providing a second particle beam, the method comprising:
    supplying the second particle beam with second charged particles onto an object using the second particle beam column;
    loading a value of a control parameter into a control unit from a database or calculating the value of the control parameter in the control unit;
    setting an objective lens excitation of a first objective lens of the first particle beam column using the value of the control parameter, wherein the objective lens excitation comprises setting a current and/or a voltage; and
    detecting second interaction particles using a particle detector, wherein the second interaction particles emerge from an interaction of the second particle beam with the object when the second particle beam is incident on the object, wherein the particle detector is disposed in a region between the first objective lens and a first beam generator of the first particle beam column and/or wherein the particle detector is disposed in the first objective lens and/or at one end of the first objective lens.

2. The method as claimed in claim 1, wherein the method further comprises one of the following steps:
  removing the first particle beam with the first charged particles, which is provided by the first particle beam column and guided to the object, from the object;
  reducing a current of the first particle beam having first charged particles, which first particle beam is provided by the first particle beam column and guided to the object, wherein the reduction is implemented in such a way that a ratio of second detection signals, which are generated by the particle detector on account of the detected second interaction particles, to first detection signals, which are generated by the particle detector on account of detected first interaction particles that emerge from an interaction of the first particle beam with the object when the first particle beam is incident on the object, is greater than 2.

3. The method as claimed in claim 2, wherein the removal of the first particle beam from the object or the reduction of the current of the first particle beam is implemented temporally before and/or during the supply of the second particle beam to the object.

4. The method as claimed in claim 2, wherein the removal of the first particle beam or the reduction of the current of the first particle beam comprises at least one of the following steps:
  guiding the first particle beam away from the object using a guiding unit;
  masking the particle beam by moving an aperture unit;
  deactivating a high-voltage supply unit of the first beam generator in such a way that the first particle beam is not generated or operating the high-voltage supply unit of the first beam generator in such a way that the first particle beam is not sufficiently generated so that the first interaction particles are not detected by the particle detector;
  guiding the first particle beam away from the object using a scanning apparatus; and
  changing an excitation of at least one condenser lens.

5. The method as claimed in claim 1, wherein the value of the control parameter is read out from the database, and wherein the method further comprises determining the value of the control parameter prior to the readout from the database, the determining of the value including:
  choosing, setting and/or determining at least one of the following properties of the particle beam device: a rotation of an object holder on which the object is disposed, a distance between the object and the first objective lens, a material of the object, a surface roughness of the object, a landing energy of the second charged particles of the second particle beam on the object, an orientation of a surface of the object and an acceleration voltage, with which the first particle beam is guided within the first particle beam column;
  altering and/or setting the value of the control parameter until an image of the object is generated with a desired image quality on account of the second detection signals of the particle detector, wherein the second detection signals are generated by the particle detector when detecting the second interaction particles with the particle detector; and
  storing the value of the control parameter in the database as a function of the chosen, set and/or determined at least one property.

6. The method as claimed in claim 1, further comprising:
  choosing, setting and/or determining at least one of the following properties of the particle beam device: a rotation of an object holder on which the object is disposed, a distance between the object and the first objective lens, a material of the object, a surface roughness of the object, a landing energy of the second charged particles of the second particle beam on the object, an orientation of a surface of the object and an acceleration voltage, with which the first particle beam is guided within the first particle beam column;
  altering and/or setting the value of the control parameter to a first value at which a first image of the object is generated with a desired image quality on account of the second detection signals of the particle detector, wherein the second detection signals are generated by the particle detector when detecting the second interaction particles with the particle detector;
  renewed choosing, setting and/or determining of the previously selected, set and/or determined at least one property of the particle beam device, namely the rotation of an object holder on which the object is disposed, the distance between the object and the first objective lens, the material of the object, the surface roughness of the object, the landing energy of the second charged particles of the second particle beam on the object, the orientation of the surface of the object and the acceleration voltage, with which the first particle beam is guided within the first particle beam column;
  altering and/or setting the value of the control parameter to a second value at which a second image of the object is generated with a desired image quality on account of the second detection signals of the particle detector, wherein the second detection signals are generated by the particle detector when detecting the second interaction particles with the particle detector; and
  determining a functional relationship between the first value of the control parameter and the second value of the control parameter as a function of the chosen, set and/or determined at least one property.

7. The method as claimed in claim 6, wherein the value of the control parameter is determined in the control unit using the functional relationship.

8. The method as claimed in claim 1, wherein the control parameter is a first control parameter, wherein the functional relationship is a first functional relationship and wherein the method further comprises the following steps:
  loading at least one value of a second control parameter into the control unit from the database or calculating the value of the second control parameter in the control unit; and
  driving at least one electrostatic and/or magnetic deflection unit for deflecting the second interaction particles in the first particle beam column on the basis of the value of the second control parameter.

9. The method as claimed in claim 8, wherein the value of the second control parameter is read out from the database, and wherein the method further comprises determining the value of the control parameter prior to the readout from the database, the determining of the value including:
  choosing, setting and/or determining at least one of the following properties of the particle beam device: the rotation of the object holder on which the object is disposed, the distance between the object and the first objective lens, the material of the object, the surface roughness of the object, the landing energy of the second charged particles of the second particle beam on the object, the orientation of the surface of the object and the acceleration voltage, with which the first particle beam is guided within the first particle beam column;

altering and/or setting the value of the second control parameter until an image of the object is generated with a desired image quality on account of second detection signals of the particle detector, wherein the second detection signals are generated by the particle detector when detecting the second interaction particles with the particle detector; and storing the value of the second control parameter in the database as a function of the chosen, set and/or determined at least one property.

10. The method as claimed in claim 8, further comprising:
choosing, setting and/or determining at least one of the following properties of the particle beam device: the rotation of the object holder on which the object is disposed, the distance between the object and the first objective lens, the material of the object, the surface roughness of the object, the landing energy of the second charged particles of the second particle beam on the object, the orientation of the surface of the object and the acceleration voltage, with which the first particle beam is guided within the first particle beam column;

altering and/or setting the value of the second control parameter to a first value of the second control parameter at which a third image of the object is generated with a desired image quality on account of the second detection signals of the particle detector, wherein the second detection signals are generated by the second particle detector when detecting the second interaction particles with the particle detector;

renewed choosing, setting and/or determining of the previously selected, set and/or determined at least one property of the particle beam device, namely the rotation of the object holder on which the object is disposed, the distance between the object and the first objective lens, the material of the object, the surface roughness of the object, the landing energy of the second charged particles of the second particle beam on the object, the orientation of the surface of the object and the acceleration voltage, with which the first particle beam is guided within the first particle beam column;

altering and/or setting the value of the second control parameter to a second value of the second control parameter at which a fourth image of the object is generated with a desired image quality on account of the second detection signals of the particle detector, wherein the second detection signals are generated by the particle detector when detecting the second interaction particles with the particle detector; and determining a second functional relationship between the first value of the second control parameter and the second value of the second control parameter as a function of the chosen, set and/or determined at least one property.

11. The method as claimed in claim 1, wherein the method comprises at least one of the following steps:
driving an additional coil, disposed on the first objective lens, for generating a magnetic field, wherein an effect of a first magnetic field, generated by the first objective lens, on the second interaction particles is at least partly compensated and/or wherein the second interaction particles are guided by the magnetic field; and driving an additional electrode, disposed on the first objective lens, for guiding the second interaction particles into the first objective lens.

12. The method as claimed in claim 1, wherein the functional relationship is determined by at least one of the following:
interpolation,
extrapolation,
forming an average,
ascertaining random values,
determining the smallest value of the set of the first value and the second value, and
determining the largest value of the set of the first value and the second value.

13. The method as claimed in claim 1, wherein the functional relationship is a linear functional relationship or a nonlinear functional relationship.

14. A computer program product comprising program code, which is loadable into a processor of a particle beam device including a first particle beam column for providing a first particle beam and a second particle beam column for providing a second particle beam, wherein the program code, when executed, controls the particle beam device in such a way that a method is carried out, the method including:
supplying the second particle beam with second charged particles onto an object using the second particle beam column;
loading a value of a control parameter into a control unit from a database or calculating the value of the control parameter in the control unit;
setting an objective lens excitation of a first objective lens of the first particle beam column using the value of the control parameter, wherein the objective lens excitation comprises setting a current and/or a voltage; and
detecting second interaction particles using a particle detector, wherein the second interaction particles emerge from an interaction of the second particle beam with the object when the second particle beam is incident on the object, wherein the particle detector is disposed in a region between the first objective lens and a first beam generator of the first particle beam column and/or wherein the particle detector is disposed in the first objective lens and/or at one end of the first objective lens.

15. A particle beam device for generating an image of an object, comprising:
at least one first particle beam column, which has a first beam generator for generating a first particle beam with first charged particles and at least one first objective lens for focusing the first particle beam onto the object;
at least one second particle beam column, which has a second beam generator for generating a second particle beam with second charged particles;
at least one movably embodied object holder for holding, positioning and/or orienting the object;
at least one particle detector for detecting second interaction particles which emerge from an interaction of the second particle beam with the object when the second particle beam is incident on the object, wherein the particle detector is disposed in the region between the first objective lens and the first beam generator in the first particle beam column and/or wherein the particle detector is disposed in the first objective lens or at one end of the first objective lens;

at least one electrostatic and/or magnetic deflection unit for guiding the second interaction particles onto the object;

at least one display unit for displaying an image of the object, wherein the image is generated by the detection of the second interaction particles using the particle detector; and at least one processor, onto which a computer program product comprising program code is loaded, wherein the program code, when executed, controls the particle beam device in such a way that a method is carried out, the method including:

supplying the second particle beam with second charged particles onto an object using the second particle beam column, loading a value of a control parameter into a control unit from a database or calculating the value of the control parameter in the control unit, setting an objective lens excitation of a first objective lens of the first particle beam column using the value of the control parameter, wherein the objective lens excitation comprises setting a current and/or a voltage, and detecting second interaction particles using a particle detector, wherein the second interaction particles emerge from an interaction of the second particle beam with the object when the second particle beam is incident on the object, wherein the particle detector is disposed in a region between the first objective lens and a first beam generator of the first particle beam column and/or wherein the particle detector is disposed in the first objective lens and/or at one end of the first objective lens.

16. The particle beam device as claimed in claim 15, wherein the first particle beam column is an electron beam column and/or wherein the second particle beam column is an ion beam column.

\* \* \* \* \*